United States Patent
Lee et al.

(10) Patent No.: US 9,704,865 B2
(45) Date of Patent: Jul. 11, 2017

(54) SEMICONDUCTOR DEVICES HAVING SILICIDE AND METHODS OF MANUFACTURING THE SAME

(71) Applicants: Hyungjong Lee, Osan-si (KR);
Wei-Hua Hsu, Seongnam-si (KR);
Junggun You, Ansan-si (KR);
Choongho Lee, Yongin-si (KR)

(72) Inventors: Hyungjong Lee, Osan-si (KR);
Wei-Hua Hsu, Seongnam-si (KR);
Junggun You, Ansan-si (KR);
Choongho Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/969,319

(22) Filed: Dec. 15, 2015

(65) Prior Publication Data
US 2016/0197074 A1    Jul. 7, 2016

(30) Foreign Application Priority Data
Jan. 5, 2015    (KR) .................. 10-2015-0000663

(51) Int. Cl.
| H01L 27/092 | (2006.01) |
| H01L 29/423 | (2006.01) |
| H01L 23/532 | (2006.01) |
| H01L 23/535 | (2006.01) |
| H01L 21/8238 | (2006.01) |

(52) U.S. Cl.
CPC .. *H01L 27/0924* (2013.01); *H01L 21/823814* (2013.01); *H01L 21/823821* (2013.01); *H01L 21/823871* (2013.01); *H01L 23/535* (2013.01); *H01L 23/53209* (2013.01); *H01L 29/42356* (2013.01); *H01L 2924/0002* (2013.01)

(58) Field of Classification Search
CPC .. H01L 27/0924; H01L 23/532; H01L 23/535
USPC ........................................ 257/369
See application file for complete search history.

(56) References Cited

U.S. PATENT DOCUMENTS

| 7,838,359 B2 | 11/2010 | Schwan et al. |
| 7,972,958 B2 | 7/2011 | Lee et al. |
| 2009/0315185 A1 | 12/2009 | Boyanov et al. |
| 2011/0147855 A1 | 6/2011 | Joshi et al. |

(Continued)

*Primary Examiner* — Kenneth Parker
*Assistant Examiner* — Warren H Kilpatrick
(74) *Attorney, Agent, or Firm* — Harness, Dickey & Pierce, P.L.C.

(57) ABSTRACT

Semiconductor devices, having dual silicides, include a first fin, having N-type impurities, and a second fin, having P-type impurities, on a substrate. A first gate electrode and a first source/drain area are on the first fin. A second gate electrode and a second source/drain area are on the second fin. An etch stop layer is on the first source/drain area and the second source/drain area. An insulating layer is on the etch stop layer. A first plug connected to the first source/drain area and a second plug connected to the second source/drain area are formed through the insulating layer and the etch stop layer. A first metal silicide layer is in the first source/drain area. A second metal silicide layer having a material different from the first metal silicide layer and having a thickness smaller than the first metal silicide layer is in the second source/drain area.

20 Claims, 20 Drawing Sheets

(56) References Cited

U.S. PATENT DOCUMENTS

| | | | |
|---|---|---|---|
| 2011/0298058 A1* | 12/2011 | Kawasaki | H01L 29/7853 257/401 |
| 2014/0106529 A1* | 4/2014 | Morin | H01L 21/28518 438/283 |
| 2014/0210011 A1 | 7/2014 | Baraskar et al. | |
| 2016/0111430 A1* | 4/2016 | Liaw | H01L 27/1104 257/384 |

* cited by examiner

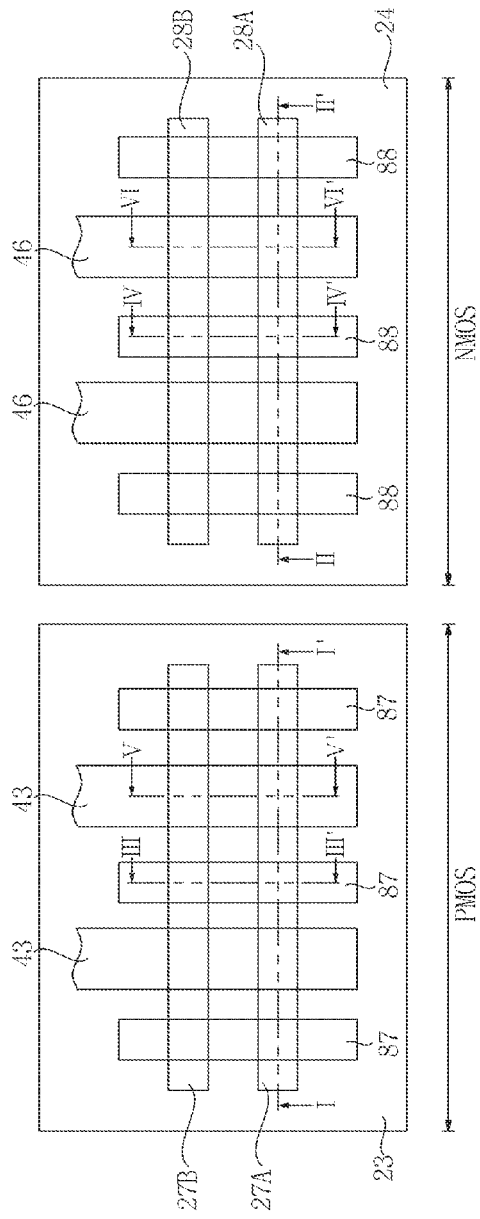
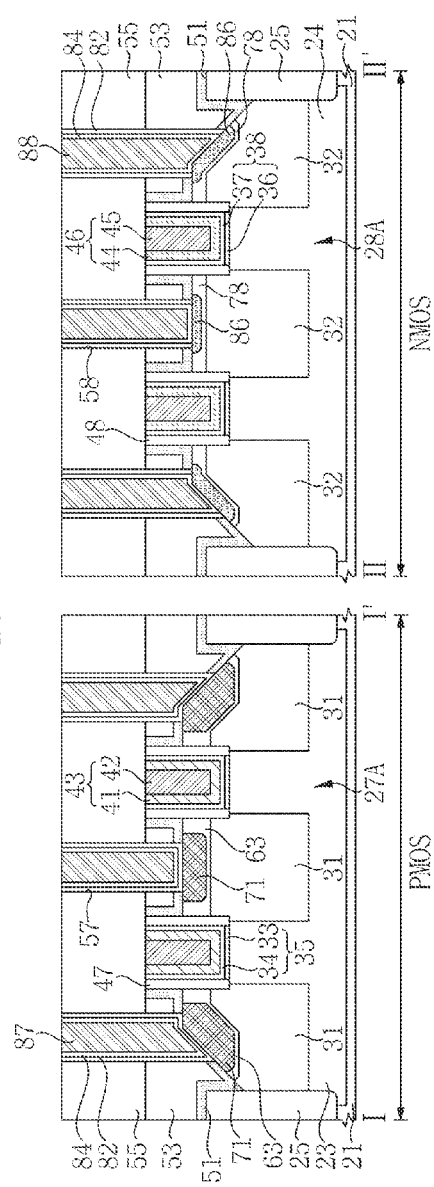
FIG. 2
FIG. 3

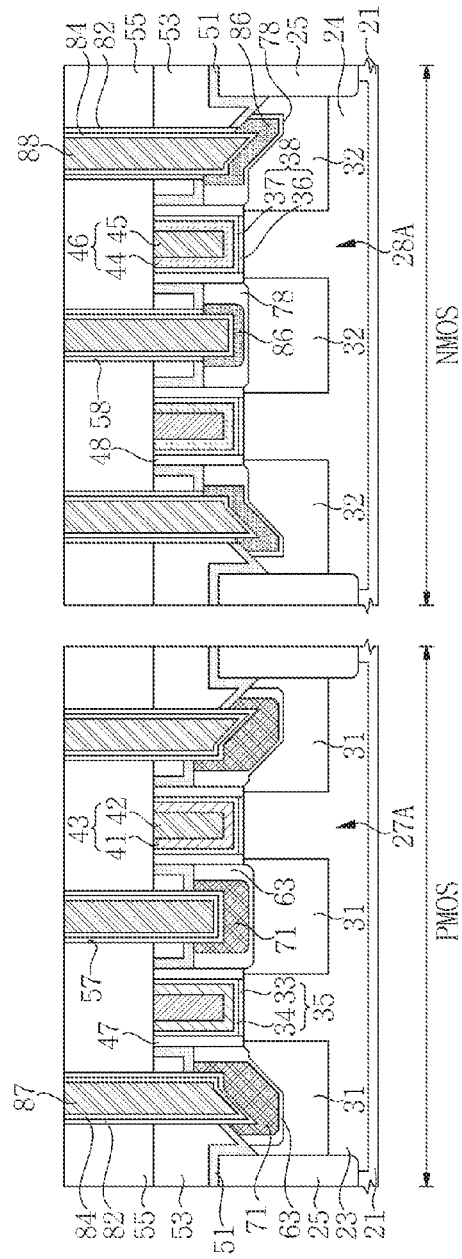
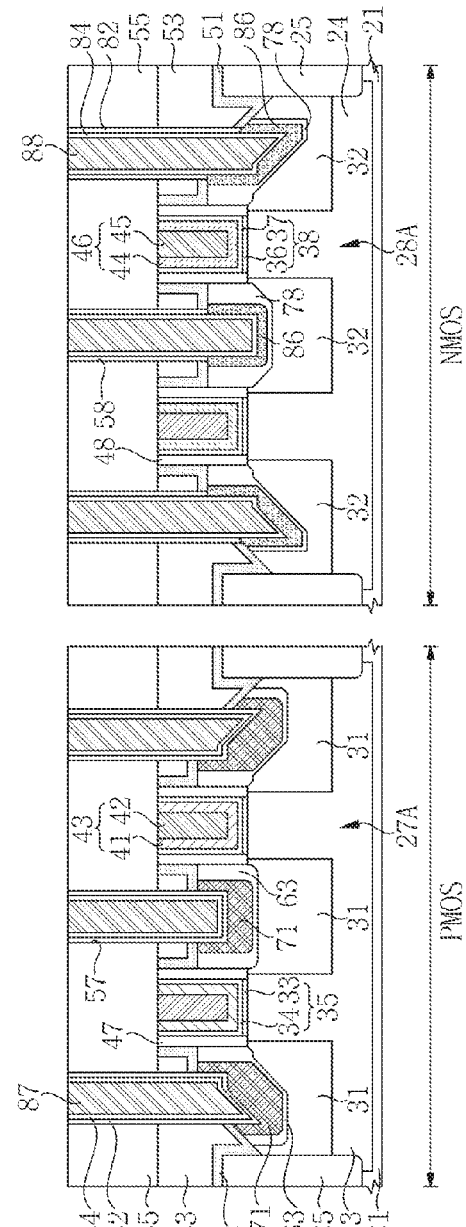
FIG. 7
FIG. 8

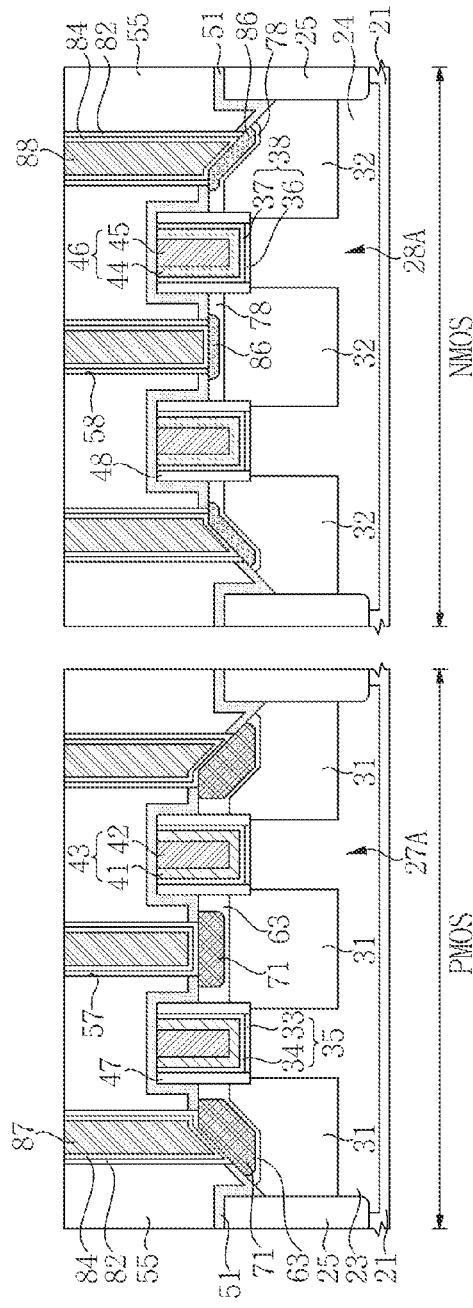
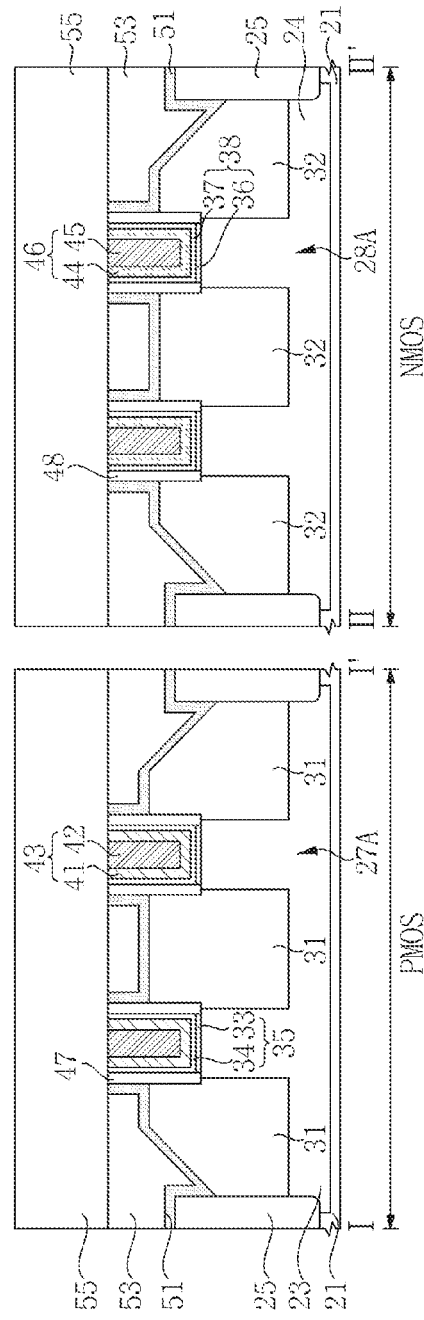
FIG. 11
FIG. 12

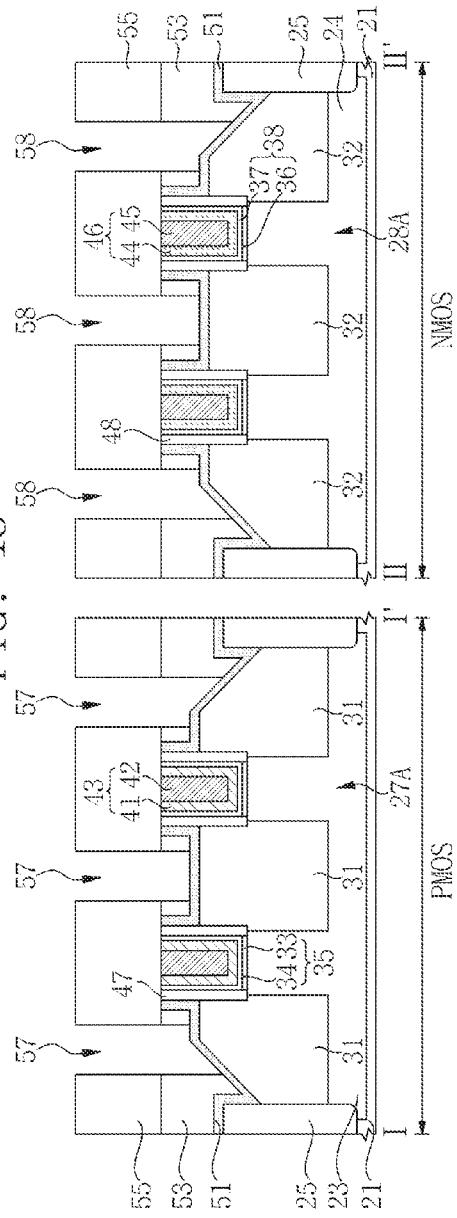
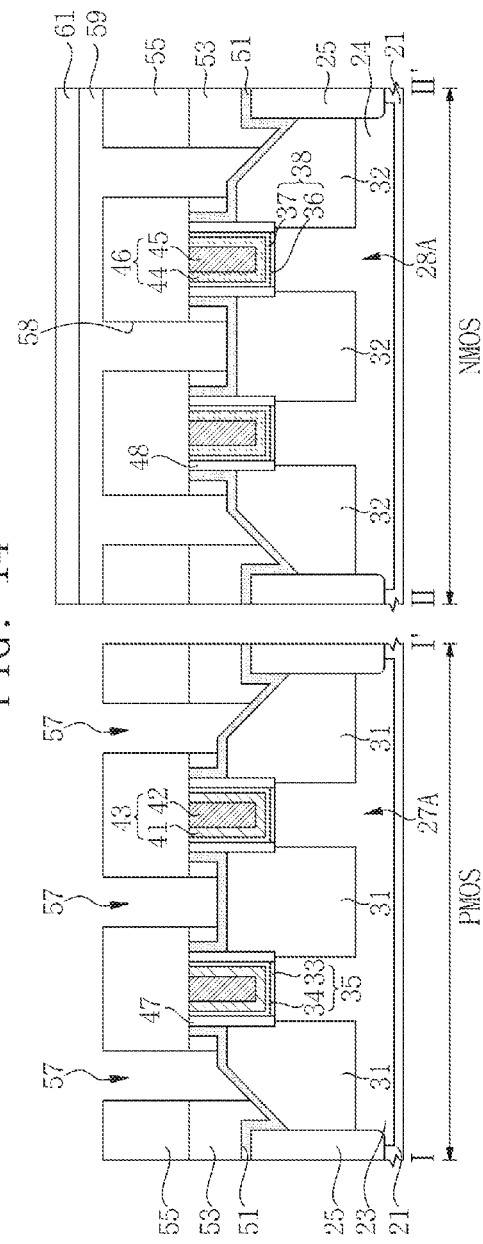

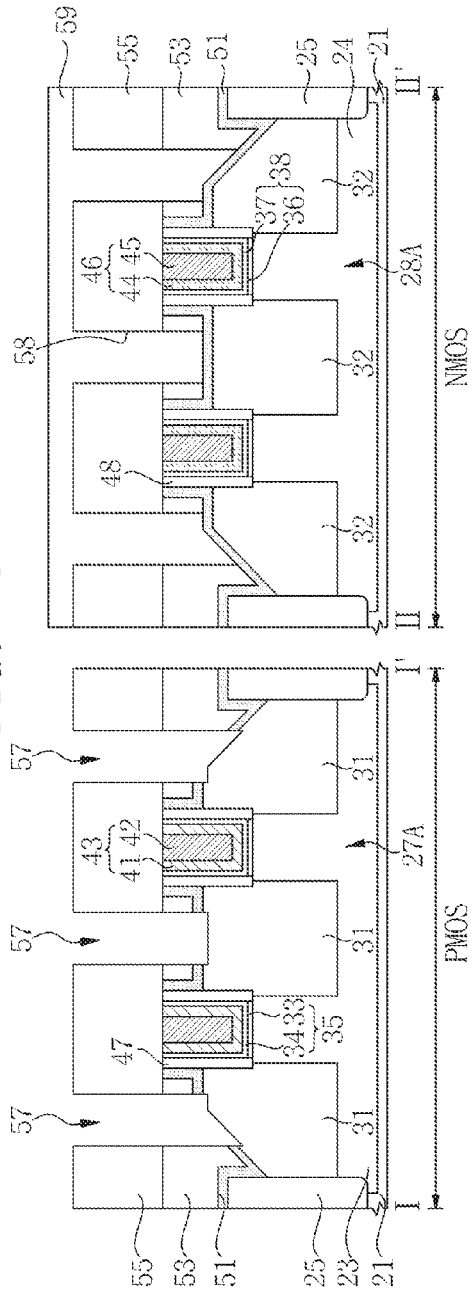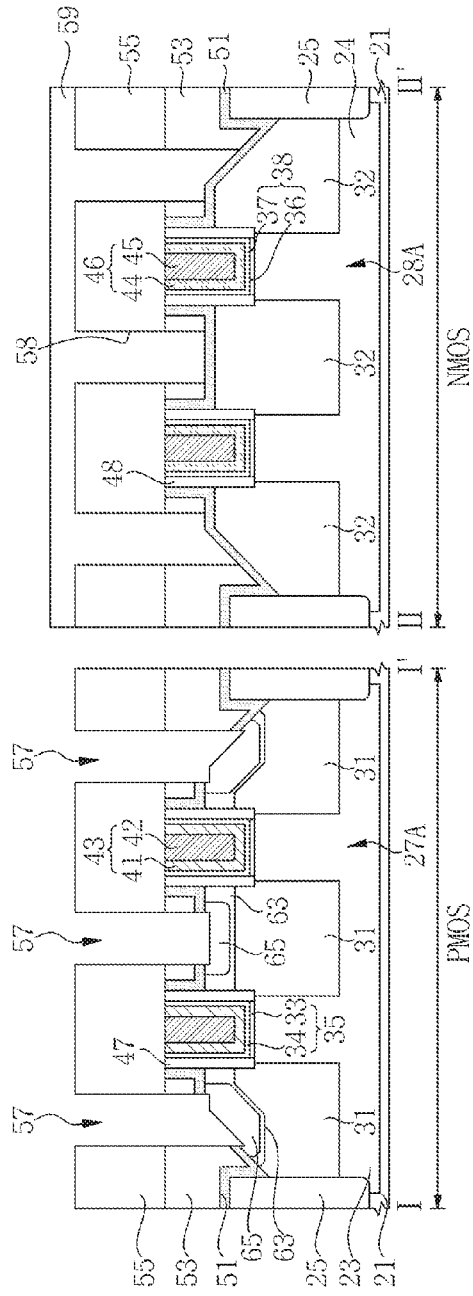

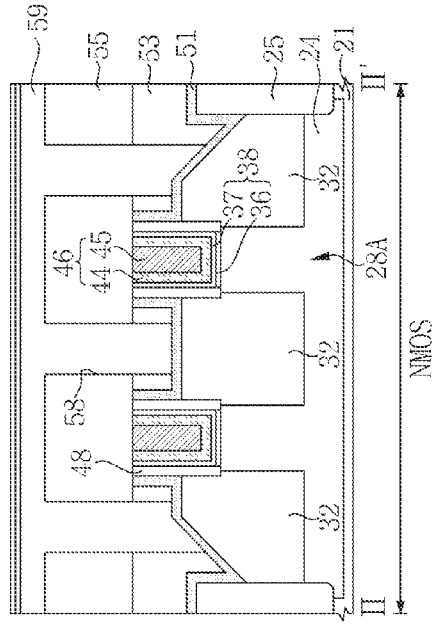
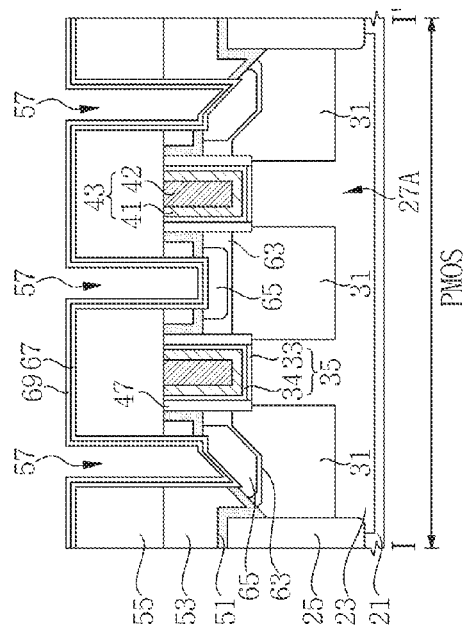
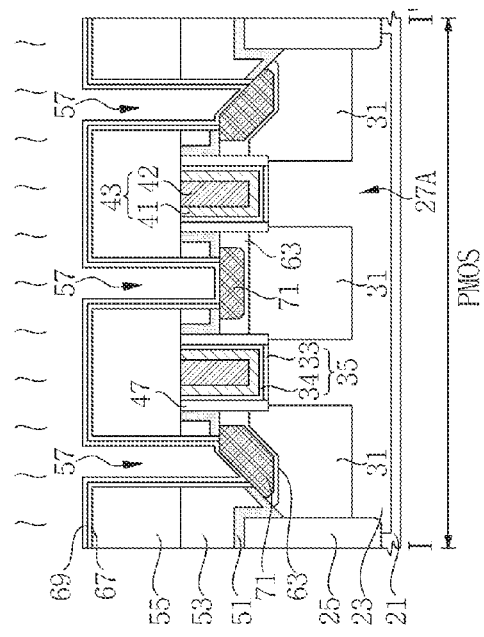
FIG. 17
FIG. 18

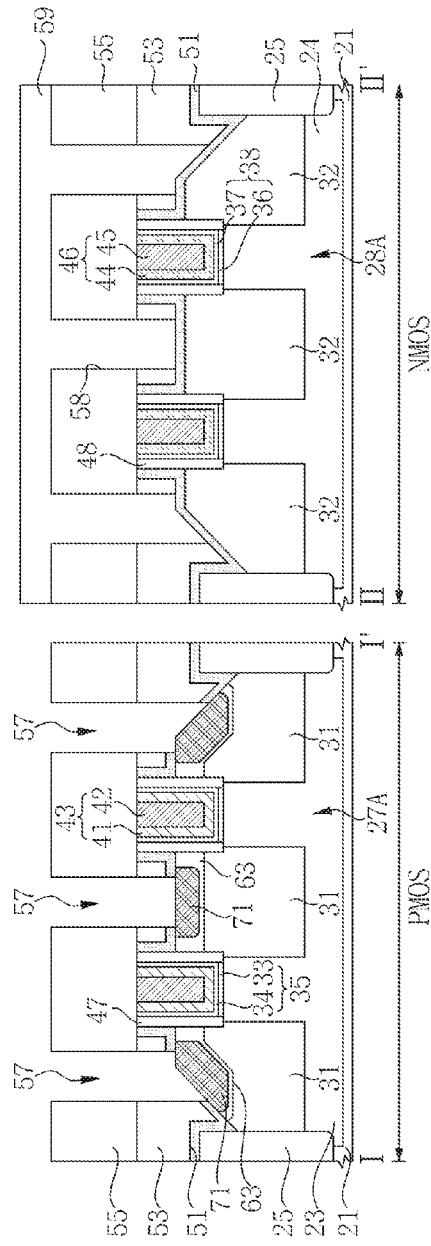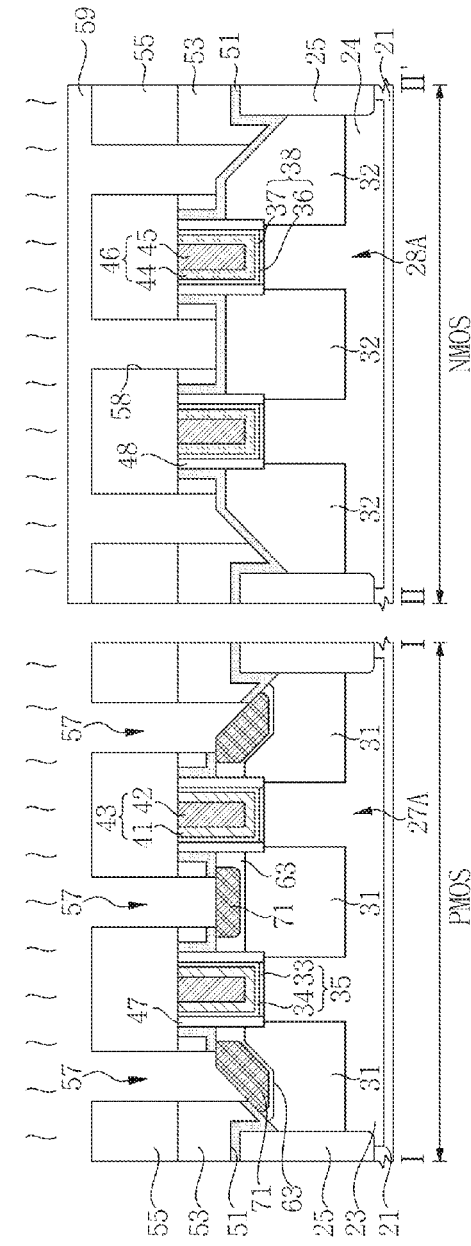
FIG. 19
FIG. 20

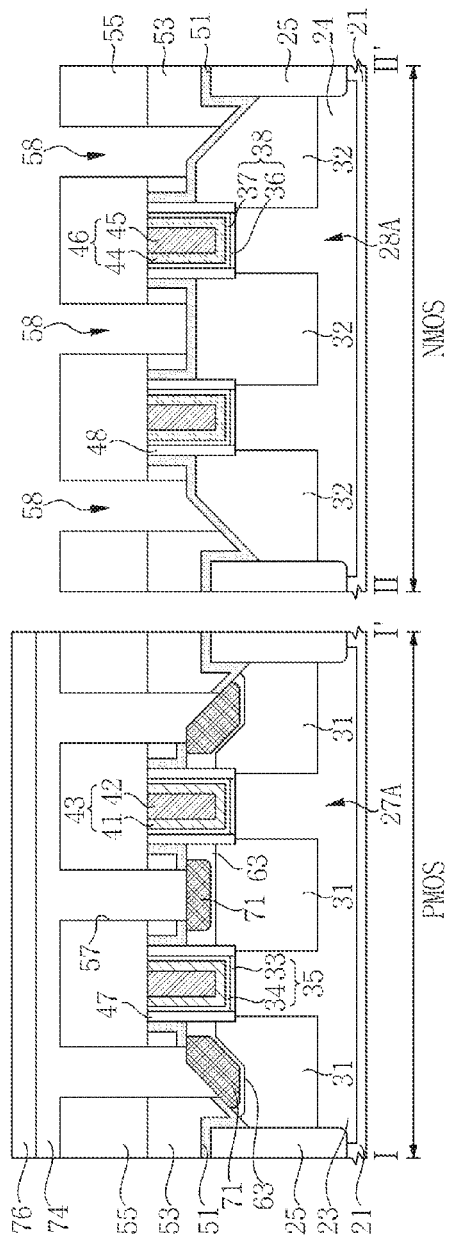

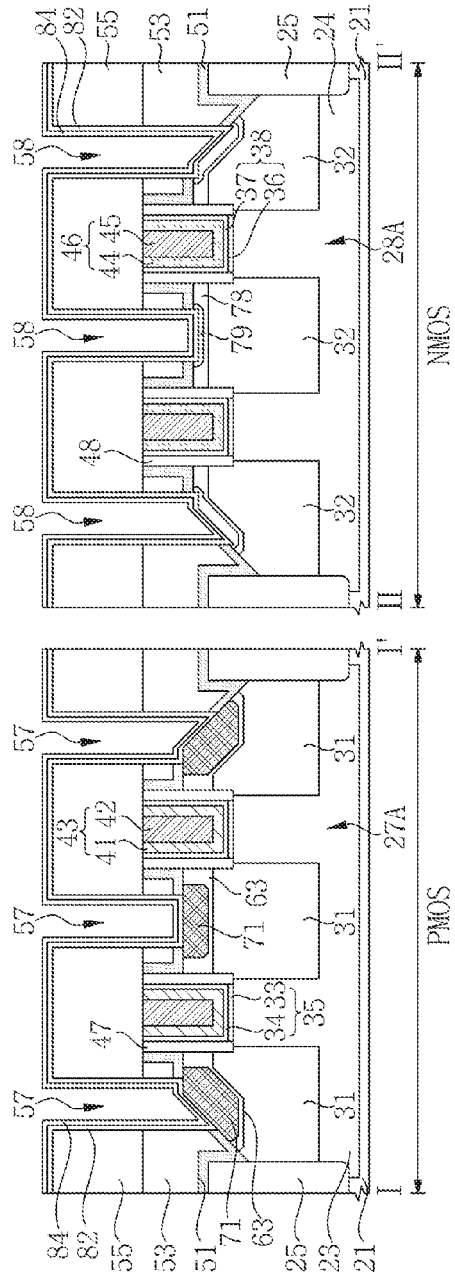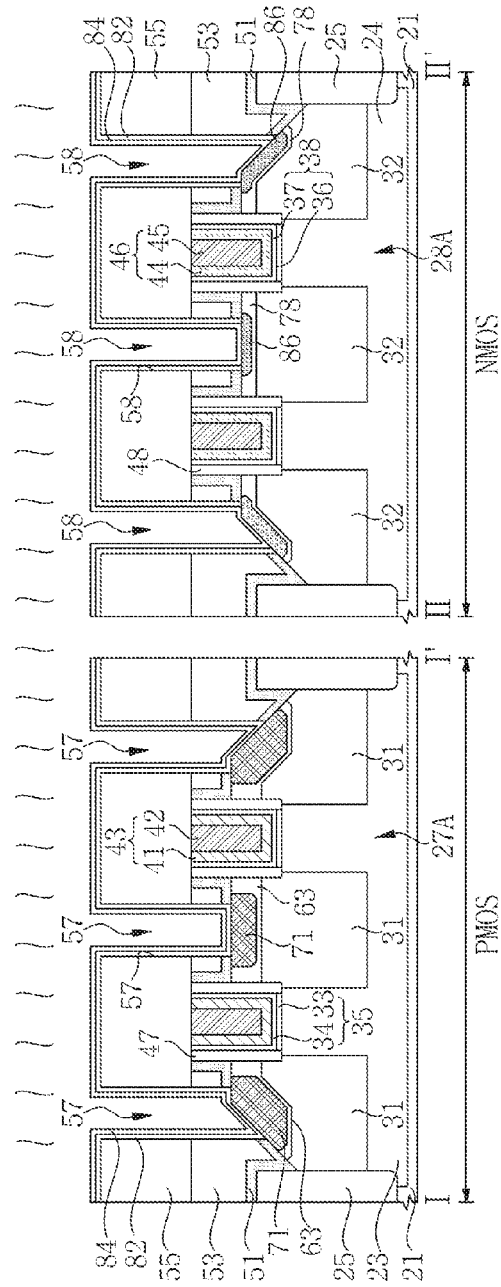

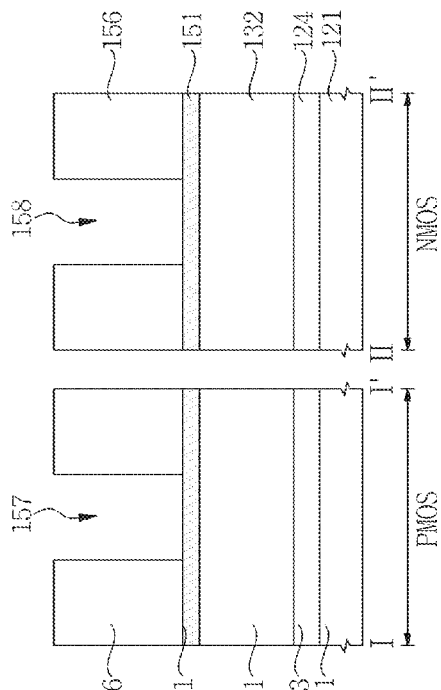
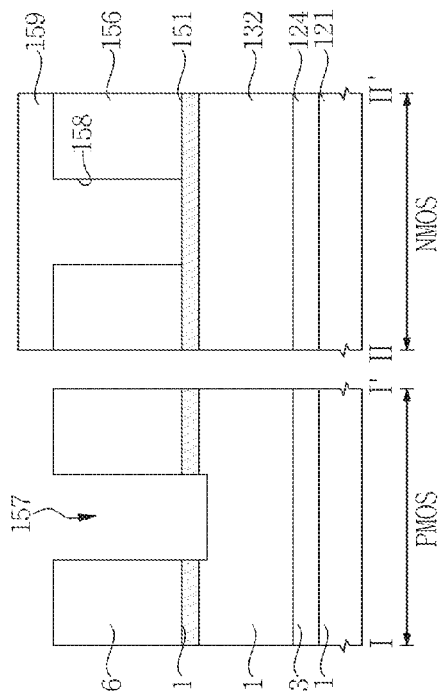
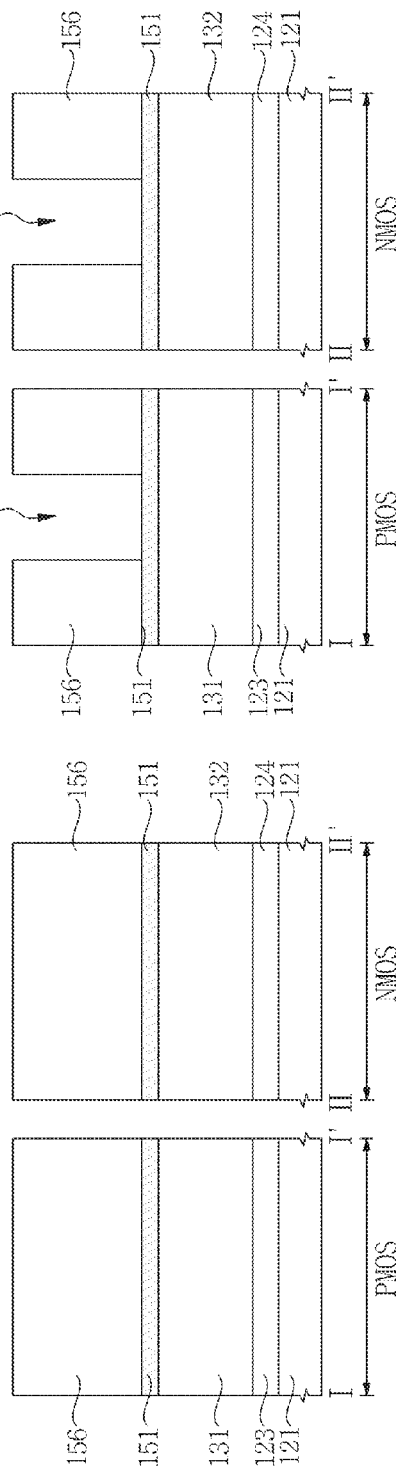
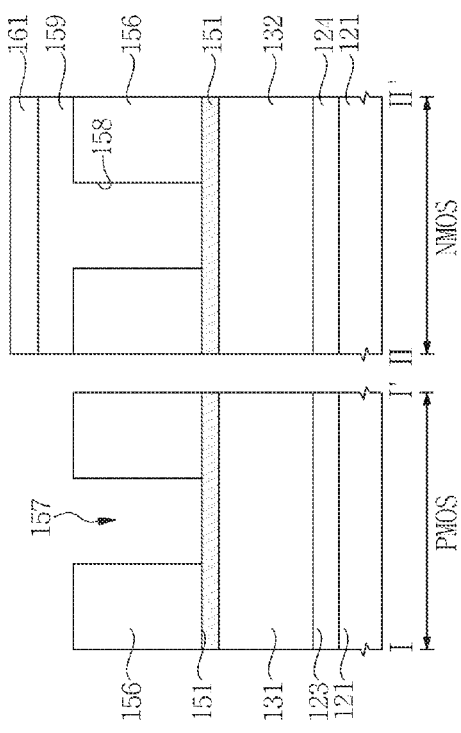

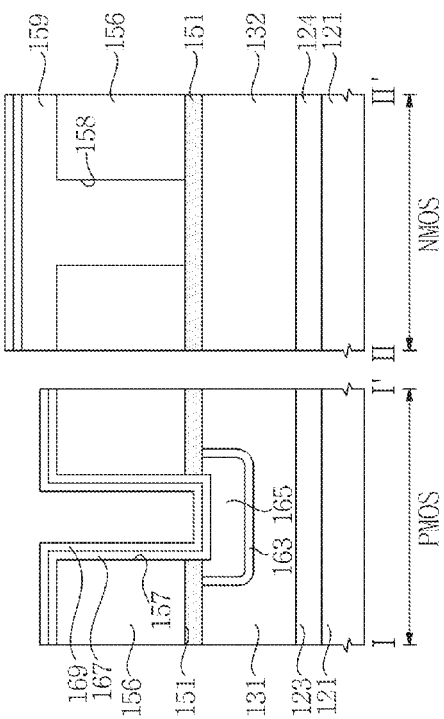
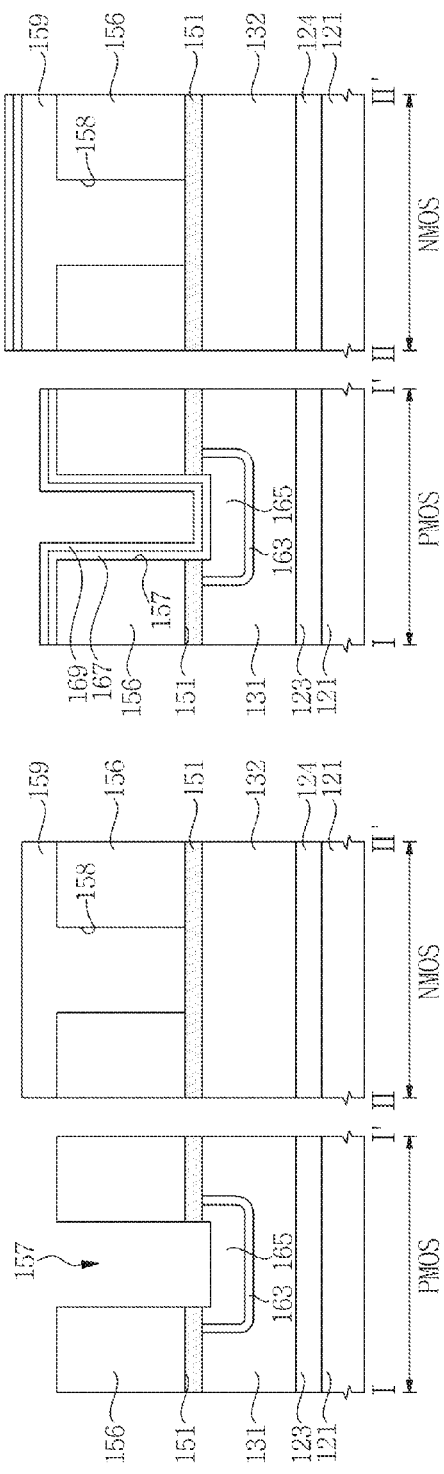
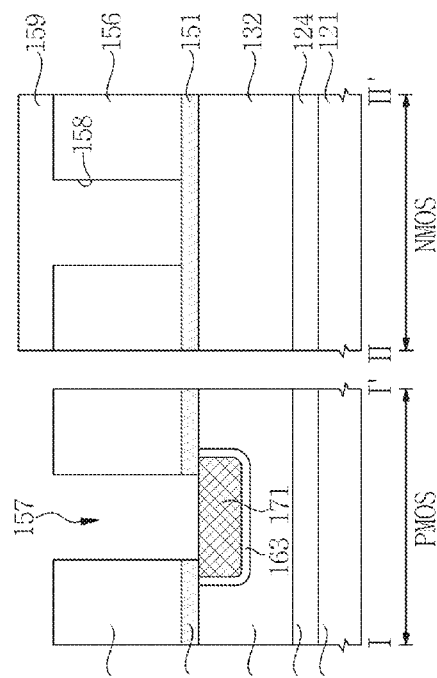
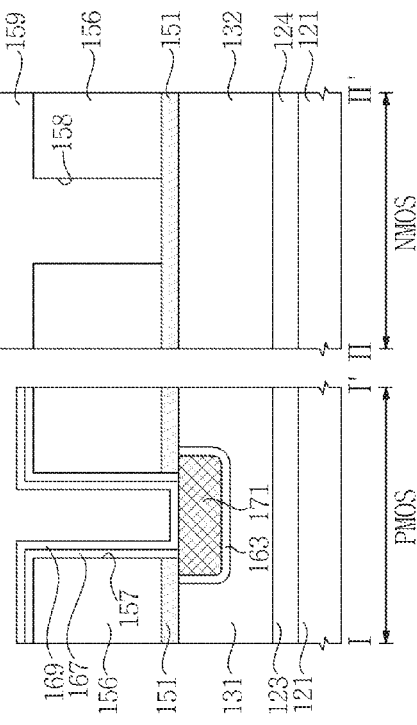

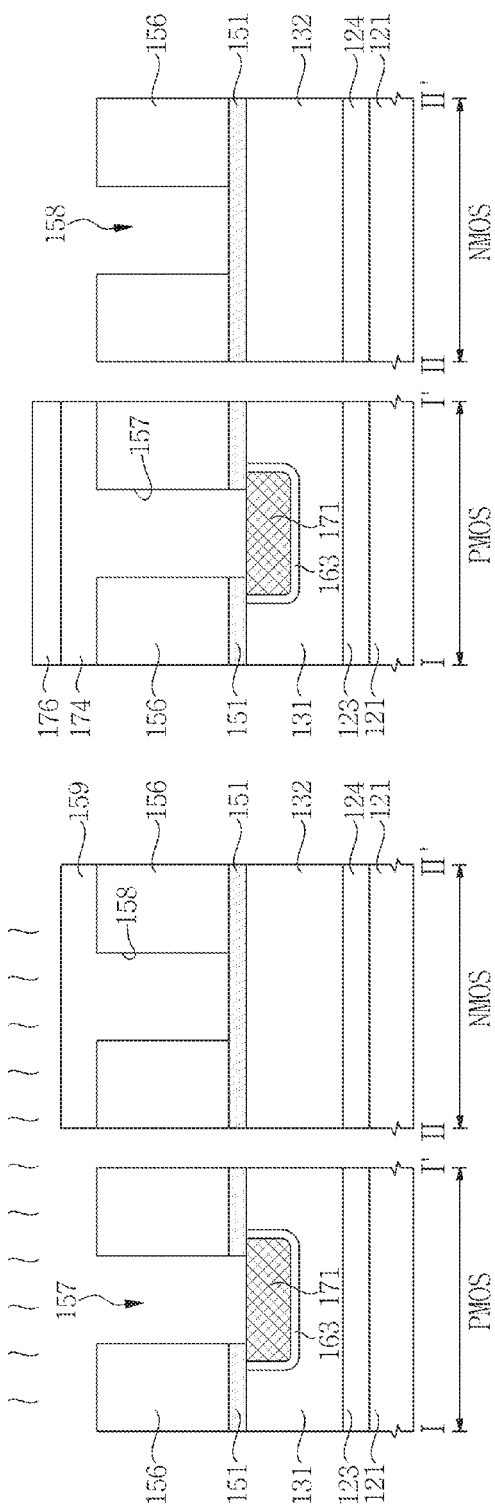
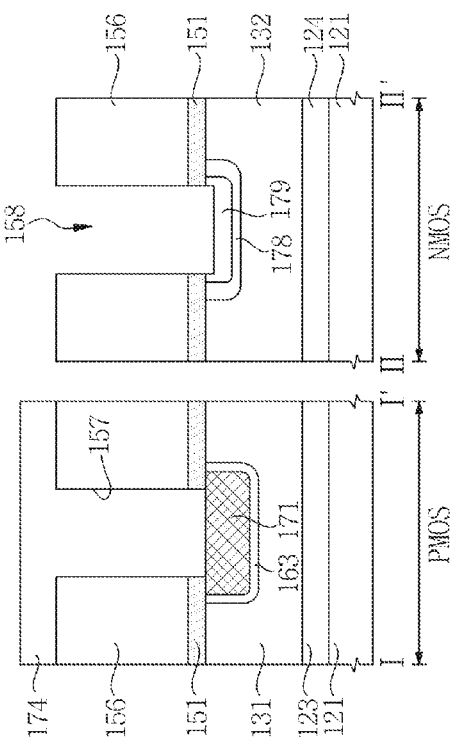
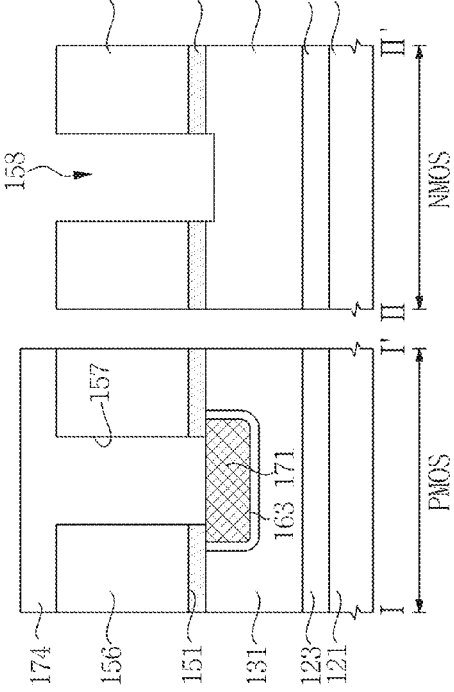
FIG. 36　　FIG. 37
FIG. 38　　FIG. 39

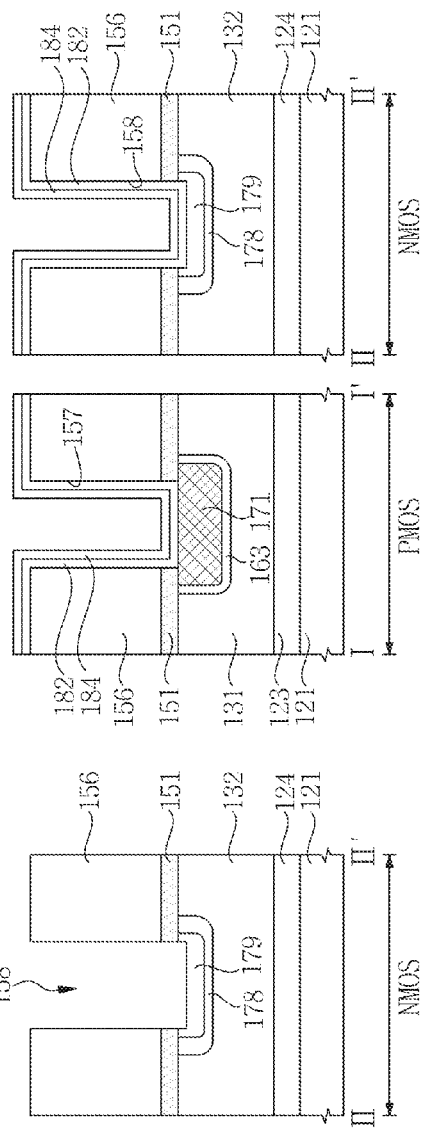
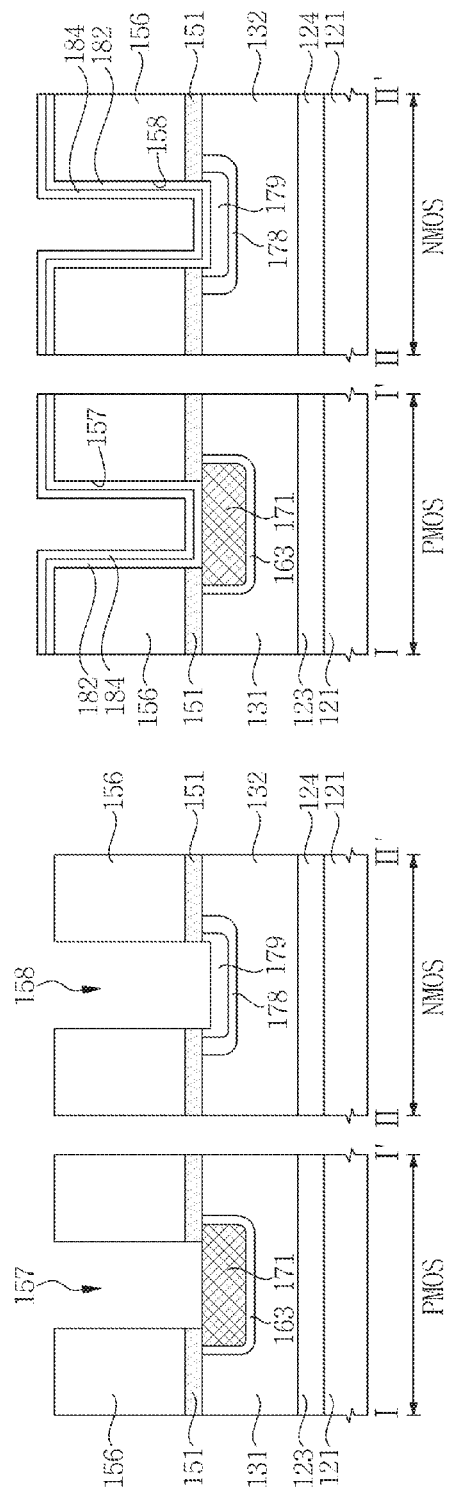
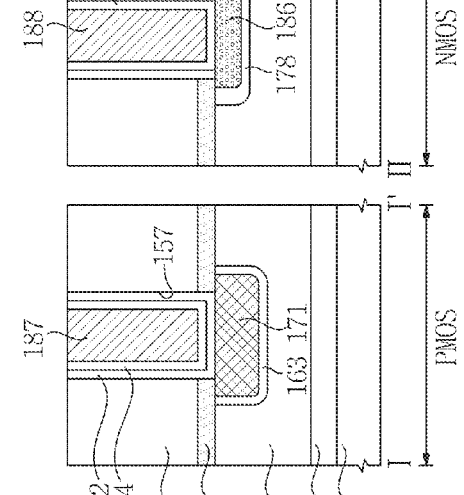
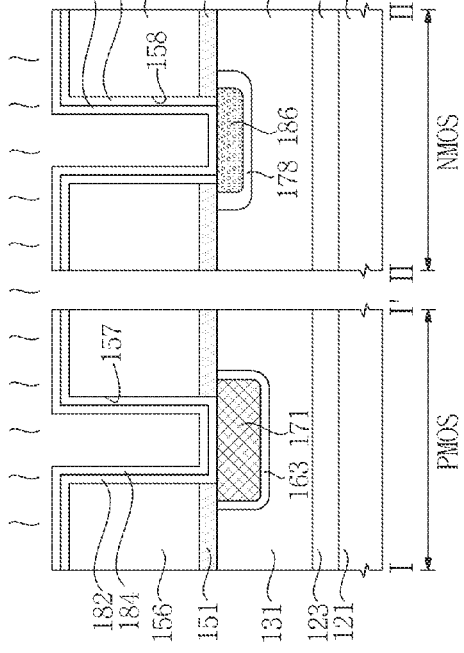

SEMICONDUCTOR DEVICES HAVING SILICIDE AND METHODS OF MANUFACTURING THE SAME

CROSS-REFERENCE TO RELATED APPLICATION

This application claims the benefit of priority under 35 U.S.C. §119 to Korean Patent Application No. 10-2015-0000663 filed on Jan. 5, 2015, the disclosure of which is hereby incorporated by reference in its entirety.

BACKGROUND

Field

Example embodiments of the inventive concepts relate to semiconductor devices having dual silicides and/or methods of manufacturing the same.

Description of Related Art

In order to reduce a contact resistance between a metal pattern and a semiconductor layer, a technique of forming a metal silicide is being developed. A first semiconductor layer having P-type impurities, and a second semiconductor layer having N-type impurities, may be formed on a semiconductor substrate. A formation of a silicide layer with the same metal as that formed between the second semiconductor layer and the metal pattern, and between the first semiconductor layer and the metal pattern, may be disadvantageous for reducing the contact resistance.

SUMMARY

Examples of the inventive concepts relate to semiconductor devices having dual silicides and/or methods of manufacturing the same.

Some example embodiments of the inventive concepts provide a semiconductor device having an excellent electrical characteristic.

Some example embodiments of the inventive concepts provide a method of forming the semiconductor device having an excellent electrical characteristic.

The technical objectives of the inventive concepts are not limited to the above disclosure; other objectives may become apparent to those of ordinary skill in the art based on the following descriptions.

In accordance with some example embodiments of the inventive concepts, a semiconductor device is provided. The device includes a first fin and a second fin on a substrate, the first fin having N-type impurities and the second fin having P-type impurities. A first gate electrode crosses the first fin and covers at least one side surface of the first fin, a second gate electrode crosses the second fin and covers at least one side surface of the second fin, are formed. A first source/drain area is on the first fin and is adjacent to a side surface of the first gate electrode, and a second source/drain area is on the second fin and is adjacent to a side surface of the second gate electrode. An etch stop layer is formed including a first etch stop layer portion on the first source/drain area and a second etch stop layer portion on the second source/drain area. An insulating layer is on the etch stop layer. A first plug connected to the first source/drain area is formed through the insulating layer and the etch stop layer. A first metal silicide layer is in the first source/drain area and is aligned with the first plug. A second plug connected to the second source/drain area is formed through the insulating layer and the etch stop layer. A second metal silicide layer is in the second source/drain area, and is aligned with the second plug. The second metal silicide layer has a material different from a material of the first metal silicide layer, and has a thickness smaller than a thickness of the first metal silicide layer. An upper end of the first source/drain area is at a level higher than an upper end of the first fin. An upper end of the second source/drain area is at a level higher than an upper end of the second fin.

The first metal silicide layer may include at least one selected from NiSi, NiPtSi, CoSi, CoPtSi, TaSi, TaPtSi, and a combination thereof. The second metal silicide layer may include TiSi.

A first gate dielectric layer may be between the first fin and the first gate electrode. A second gate dielectric layer may be between the second fin and the second gate electrode. An upper end of the first gate dielectric layer may be at a level higher than a center of the first gate electrode. An upper end of the second gate dielectric layer may be at a level higher than a center of the second gate electrode.

The first gate dielectric layer may include a lower dielectric layer directly contacting the first fin. The first gate dielectric layer may include an upper dielectric layer directly contacting a bottom and side surfaces of the first gate electrode. The upper dielectric layer may be formed between the lower dielectric layer and the first gate electrode.

The device may further include a first metal layer surrounds side surfaces and bottoms of the first plug and the second plug. A second metal layer may be between the first metal layer and the first metal silicide layer and between the first metal layer and the insulating layer. The first metal layer may directly contact the second metal silicide layer.

The first metal layer may be a TiN layer, and the second metal layer may be a Ti layer.

An upper end of the first metal silicide layer may be at a level higher than an upper end of the second metal silicide layer.

A lower surface of the second metal silicide layer may be at a level higher than a lower surface of the first metal silicide layer.

A lower surface of the first metal silicide layer may be at a level higher than a lower surface of the first gate electrode. A lower surface of the second metal silicide layer may be at a level higher than a lower surface of the second gate electrode.

An upper surface of the first metal silicide layer may be at a level higher than a lower surface of the first plug. An upper surface of the second metal silicide layer may be at a level higher than a lower surface of the second plug.

An isolation layer may be in a periphery of the first fin and the second fin. An upper end of the isolation layer may be at a level higher than upper ends of the first fin and the second fin.

Each of the first fin and the second fin may have a vertical height greater than a horizontal width.

Each of the first plug and the second plug may have a vertical height greater than a horizontal width.

In accordance with some example embodiments of the inventive concepts, a semiconductor device is provided. The device includes a first fin and a second fin on a substrate, the first and second fins having N-type impurities, and being spaced apart from each other. A third fin and a fourth fin are on the substrate, the third and fourth fins having P-type impurities, and being spaced apart from each other. A first source/drain area is on the first fin. A second source/drain area is on the second fin and contacting the first source/drain area. A third source/drain area is on the third fin. A fourth source/drain area is on the fourth fin and contacts the third source/drain area. A first plug is on the first source/drain area and the second source/drain area. A first metal silicide layer is between the first plug and the first source/drain area and between the first plug and the second source/drain area. A second plug is on the third source/drain area and the fourth source/drain area. A second metal silicide layer is between the second plug and the third source/drain area and between the second plug and the fourth source/drain area. The second metal silicide layer has a material different from a material of the first metal silicide layer, and has a thickness smaller than a thickness the first metal silicide layer.

Side surfaces of the first source/drain area and the second source/drain area may contact each other. Side surfaces of the third source/drain area and the fourth source/drain area may contact each other.

The semiconductor device may further include an etch stop layer including a first etch stop layer portion on the first source/drain area and the second source/drain area, and a second etch stop layer portion on the third source/drain area and the fourth source/drain area. An insulating layer may be formed on the etch stop layer. The first plug may be connected to the first metal silicide layer through the insulating layer and the etch stop layer. The second plug may be connected to the second metal silicide layer through the insulating layer and the etch stop layer.

The semiconductor device may further include a first metal layer covering bottoms of the first plug and the second plug, and a second metal layer between the first metal layer and the first metal silicide layer. The first metal layer may directly contact the second metal silicide layer.

The first metal layer may be a TiN layer, and the second metal layer may be a Ti layer.

Upper ends of the first source/drain area and the second source/drain area may be at a level higher than upper ends of the first fin and the second fin. Upper ends of the third source/drain area and the fourth source/drain area may be at a level higher than upper ends of the third fin and the fourth fin.

In accordance with some example embodiments of the inventive concepts, a semiconductor device is provided. The device includes a first fin and a second fin on a substrate, the first fin having a first conductivity type and a second fin having a second conductivity type different from the first conductivity type. A first gate electrode crosses the first fin and a second gate electrode crosses the second fin. A first source/drain area is on the first fin and adjacent to a side surface of the first gate electrode, and a second source/drain area is on the second fin and adjacent to a side surface of the second gate electrode. The device includes an etch stop layer including a first etch stop layer portion on the first source/drain area and a second etch stop layer portion on the second source/drain area. An insulating layer is formed on the etch stop layer. The device includes a first plug connected to the first source/drain area through the insulating layer and the etch stop layer. A first metal silicide layer is between the first source/drain area and the first plug and is aligned with the first plug. The device includes a second plug connected to the second source/drain area through the insulating layer and the etch stop layer. A second metal silicide layer is between the second source/drain area and the second plug, and is aligned with the second plug. The second metal silicide layer has a material different from a material of the first metal silicide layer, and has a thickness different from a thickness of the first metal silicide layer. An upper end of the first source/drain area is at a level higher than an upper end of the first fin. An upper end of the second source/drain area is at a level higher than an upper end of the second fin.

In accordance with some example embodiments of the inventive concepts, a method of forming a semiconductor device is provided. The method includes forming a first source/drain area having P-type impurities and a second source/drain area having N-type impurities on a substrate. An etch stop layer is formed on the first source/drain area and the second source/drain area. An insulating layer is formed on the etch stop layer. A first opening and a second opening exposing the etch stop layer through the insulating layer, are formed. The first opening is aligned on the first source/drain area, and the second opening is aligned on the second source/drain area. A first blocking layer is formed filling the second opening. The first source/drain area is exposed through the first opening by removing the exposed etch stop layer. A first metal silicide layer is on the exposed first source/drain area. A second blocking layer filling the first opening is formed. The etch stop layer is exposed through the second opening by removing the first blocking layer. The second source/drain area is exposed through the second opening by removing the exposed etch stop layer. A second metal silicide layer having a material different from a material of the first metal silicide layer is formed in the exposed second source/drain area. The second blocking layer is removed. A first plug is formed in the first opening, and a second plug is formed in the second opening. The first blocking layer includes a spin on hardmask (SOH) material or a spin on glass (SOG) material. The first blocking layer has a temperature of about 800° C. or more.

Each of the first opening and the second opening may have a vertical height greater than a horizontal width.

The second blocking layer may include an SOH material or an SOG material, and the second blocking layer may have a temperature of about 800° C. or more.

The first metal silicide layer may include at least one selected from NiSi, NiPtSi, CoSi, CoPtSi, TaSi, TaPtSi, and a combination thereof. The second metal silicide layer may include TiSi.

A first metal layer may surround side surfaces and bottoms of the first plug and the second plug. A second metal layer may be between the first metal layer and the first metal silicide layer and between the first metal layer and the insulating layer. The first metal layer may directly contact the second metal silicide layer.

The first metal layer may be a TiN layer, and the second metal layer may be a Ti layer.

An upper end of the first metal silicide layer may be at a level higher than an upper end of the second metal silicide layer.

A lower surface of the second metal silicide layer may be at a level higher than a lower surface of the first metal silicide layer.

An upper surface of the first metal silicide layer may be at a level higher than a lower surface of the first plug. An upper surface of the second metal silicide layer may be at a level higher than a lower surface of the second plug.

Each of the first plug and the second plug may have a vertical height greater than a horizontal width.

The first metal silicide layer may have a thickness greater than a thickness of the second metal silicide layer.

According to some example embodiments, a semiconductor device includes a substrate including at least two first fins protruding from an upper surface of the substrate, the at least two first fins extending in a first direction in parallel to each other, and the at least two first fins being doped with impurities having a different conductivity than each other; a first plug and a second plug each extending across the at least two first fins, the first and second plugs extending in a second direction in parallel to each other, and the second direction being substantially perpendicular to the first direction; a first source/drain area and a second source/drain area respectively contacting the at least two first fins; at least two gate electrodes on an upper end of a respective one of the first and second source/drain areas, a lower end of the at least two gate electrodes respectively contacting the at least two first fins; and a first metal silicide layer between the first plug and the first source/drain area, and a second metal silicide layer between the second plug and the second source/drain area. The first metal silicide layer has a thickness different than a thickness of the second metal silicide layer. The first metal silicide layer includes a first metal silicide, and the second metal silicide layer includes a second metal silicide, the first metal silicide being different than the second metal silicide.

The substrate may include at least two second fins protruding from the upper surface of the substrate. The semiconductor may further include a third source/drain area and a fourth source/drain area respectively contacting the at least two second fins. The first metal silicide layer may be a single layer continuously extending over the third source/drain area and the first source/drain area, and the second metal silicide layer may be a single layer continuously extending over the fourth source/drain area and the second source/drain area.

The at least two gate electrodes may be partially recessed within the upper end of the respective one of the first and second source/drain areas. Upper ends of the at least two first fins may be respectively at a lower level than lower ends of the first and second metal silicide layers.

The first plug and the second plug may be respectively recessed within the first and second source/drain areas. A lower end of the second metal silicide layer may be at a same level or a lower level than an upper end of one of the at least two first fins.

The first metal silicide layer may consist essentially of the first metal silicide, and the second metal silicide layer may consist essentially of the second metal silicide.

Details of example embodiments are included in detailed explanations and the drawings.

BRIEF DESCRIPTION OF THE DRAWINGS

Example embodiments will be more clearly understood from the following detailed description taken in conjunction with the accompanying drawings. FIGS. 1-45 represent non-limiting, example embodiments as described herein. The drawings are not necessarily to scale, emphasis instead being placed upon illustrating the principles of example embodiments of the inventive concepts. In the drawings:

FIG. 1 shows cross-sectional views for describing a semiconductor device in accordance with some example embodiments of the inventive concepts;

FIG. 2 shows layouts for describing a semiconductor device in accordance with some example embodiments of the inventive concepts;

FIG. 3 shows cross-sectional views taken along lines I-I' and II-II' of FIG. 2;

FIG. 4 shows cross-sectional views taken along lines III-III' and IV-IV' of FIG. 2;

FIG. 5 shows cross-sectional views taken along lines V-V' and VI-VI' of FIG. 2;

FIGS. 6 to 11 are cross-sectional views for describing a semiconductor device in accordance with some example embodiments of the inventive concepts;

FIGS. 12 to 27 are cross-sectional views taken along lines I-I' and II-II' of FIG. 2 for describing a method of manufacturing a semiconductor device in accordance with some example embodiments of the inventive concepts;

FIGS. 28 to 43 are cross-sectional views for describing a method of manufacturing a semiconductor device in accordance with some example embodiments of the inventive concepts; and FIGS. 44 and 45 are system block diagrams of electronic devices in accordance with some example embodiments of the inventive concepts.

DETAILED DESCRIPTION OF EXAMPLE EMBODIMENTS

Figure 1:
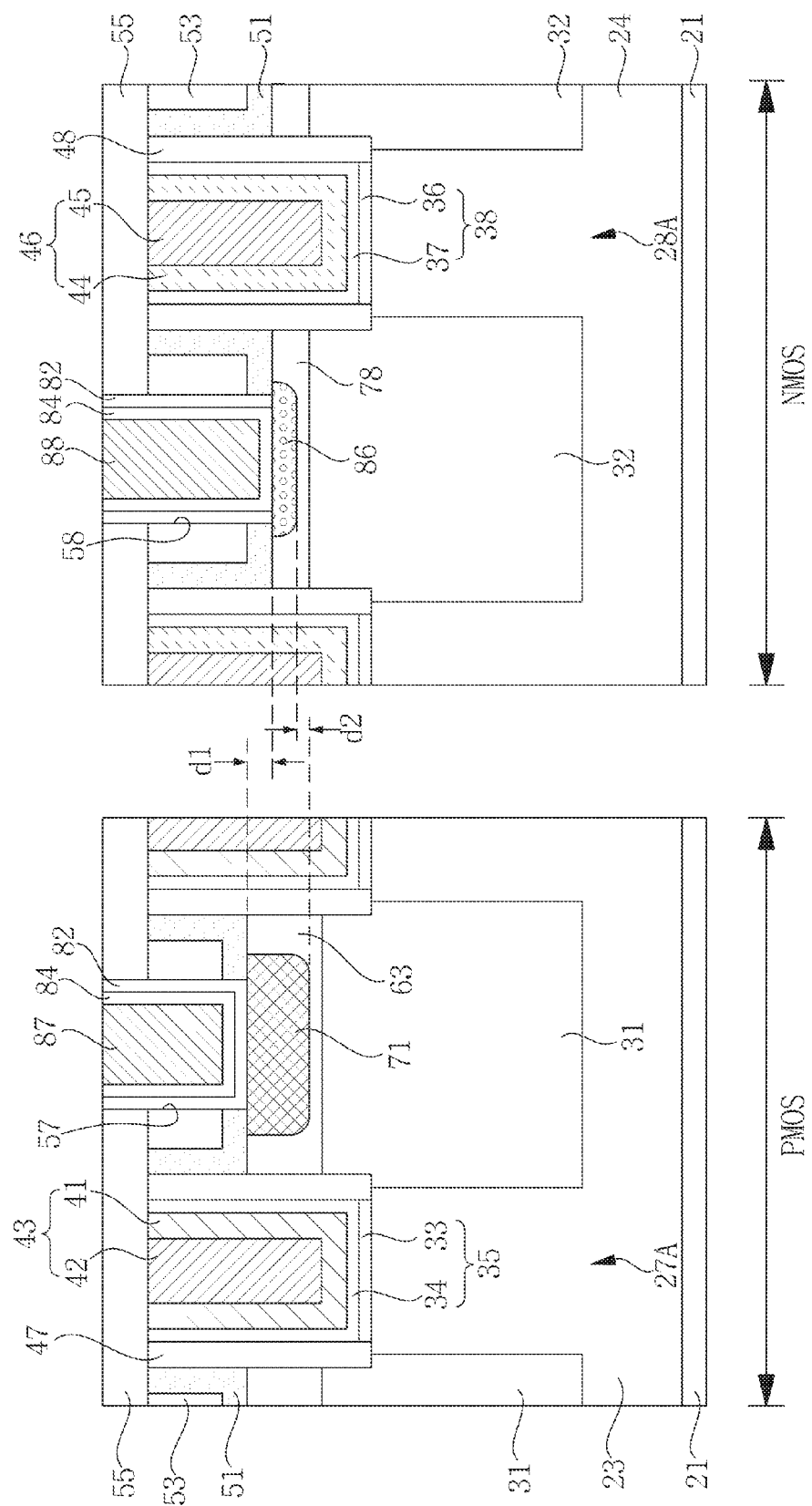

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising." "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The example embodiments will be described with reference to cross-sectional views and/or plan views, which are ideal views. Thicknesses of layers and areas are exaggerated for effective description of the technical contents in the drawings. Forms of the example embodiments may be modified by the manufacturing technology and/or tolerance. Therefore, the example embodiments are not intended to be limited to illustrated specific forms, and include modifications of forms generated according to manufacturing processes. For example, an etching area illustrated at a right angle may be round or have a set (or, alternatively, predetermined) curvature. Therefore, areas illustrated in the drawings have overview properties, and shapes of the areas are illustrated special forms of the areas of a device, and are not intended to be limited in scope.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Terms such as "front side," and "back side" may be used in a relative sense herein to facilitate easy understanding of the inventive concepts. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same example embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments of the inventive concepts relate to semiconductor devices having dual silicides and/or methods of manufacturing the same FIG. 1 shows cross-sectional views for describing a semiconductor device in accordance with some example embodiments of the inventive concepts.

Referring to FIG. 1, an N-well 23, a P-well 24, a first fin 27A, a second fin 28A, a first source/drain area 31, a second source/drain area 32, a first gate dielectric layer 35, a second gate dielectric layer 38, a first gate electrode 43, a second gate electrode 46, a first spacer 47, a second spacer 48, an etch stop layer 51, a lower insulating layer 53, an upper insulating layer 55, a first plug impurity area 63, a second plug impurity area 78, a first metal silicide layer 71, a second metal silicide layer 86, a second metal layer 82, a second capping layer 84, a first plug 87, and a second plug 88 may be formed on a substrate 21 having a PMOS area PMOS and an NMOS area NMOS.

An upper end of the first source/drain area 31 may be formed at a level higher than an upper end of the second source/drain area 32. The upper ends of the first source/drain area 31 and the second source/drain area 32 may be formed at a level higher than upper ends of the first fin 27A and the second fin 28A, respectively. The upper ends of the first source/drain area 31 and the second source/drain area 32 may be formed at a level higher than lower surfaces of the first gate electrode 43 and the second gate electrode 46, respectively. The etch stop layer 51 may cover the first source/drain area 31 and the second source/drain area 32. The etch stop layer 51 may cover side surfaces of the first spacer 47 and the second spacer 48. The etch stop layer 51 may partially cover the side surfaces of the first spacer 47 and the second spacer 48.

The first metal silicide layer 71 may be formed in the first source/drain area 31. The second metal silicide layer 86 may be formed in the second source/drain area 32. The first metal silicide layer 71 may include at least one selected from NiSi, NiPtSi, CoSi, CoPtSi, TaSi, TaPtSi, and a combination thereof. The second metal silicide layer 86 may include TiSi. The first metal silicide layer 71 may be aligned with a first opening 57 passing through the upper insulating layer 55, the lower insulating layer 53, and the etch stop layer 51. The second metal silicide layer 86 may be aligned with a second opening 58 passing through the upper insulating layer 55, the lower insulating layer 53, and the etch stop layer 51.

The second metal layer 82, the second capping layer 84, and the first plug 87 may be formed in the first opening 57. The second capping layer 84 may surround side surfaces and a bottom of the first plug 87. The second metal layer 82 may surround side surfaces and a bottom of the second capping layer 84. The second capping layer 84 may be formed between the first plug 87 and the second metal layer 82. The second metal layer 82 may be interposed between the first metal silicide layer 71 and the second capping layer 84. The second metal layer 82 may directly contact the first metal silicide layer 71.

The second metal layer 82, the second capping layer 84, and the second plug 88 may be formed in the second opening 58. The second capping layer 84 may surround side surfaces and a bottom of the second plug 88. The second capping layer 84 may directly contact the second metal silicide layer 86. The second metal layer 82 may cover the side surfaces of the second capping layer 84.

The first metal silicide layer 71 may have a thickness greater than the second metal silicide layer 86. The first metal silicide layer 71 may have the thickness of three to ten times the thickness of second metal silicide layer 86. An upper end of the first metal silicide layer 71 may be formed at a level higher than an upper end of the second metal silicide layer 86. A vertical difference between the upper end of the first metal silicide layer 71 and the upper end of the second metal silicide layer 86 may be a first distance d1. A lower end of the first metal silicide layer 71 may be formed at a level lower than a lower end of the second metal silicide layer 86. A vertical difference between the lower end of the first metal silicide layer 71 and the lower end of the second metal silicide layer 86 may be a second distance d2.

The upper end of the first metal silicide layer 71 may be formed at a level higher than an upper end of the first fin 27A. The lower end of the first metal silicide layer 71 may be formed at a level higher than the upper end of the first fin 27A. The upper end of the first metal silicide layer 71 may be formed at a level higher than an area adjacent to a lower surface of the first gate electrode 43. The lower end of the first metal silicide layer 71 may be formed at a level higher than the area adjacent to the lower surface of the first gate electrode 43.

The upper end of the second metal silicide layer 86 may be formed at a level higher than an upper end of the second fin 28A. The lower end of the second metal silicide layer 86 may be formed at a level higher than the upper end of the second fin 28A. The upper end of the second metal silicide layer 86 may be formed at a level higher than an area adjacent to a lower surface of the second gate electrode 46. The lower end of the second metal silicide layer 86 may be formed at a level higher than the area adjacent to the lower surface of the second gate electrode 46.

The first gate dielectric layer 35 may include a first lower gate dielectric layer 33 and a first upper gate dielectric layer 34. The second gate dielectric layer 38 may include a second lower gate dielectric layer 36 and a second upper gate dielectric layer 37. The first gate electrode 43 may include a first lower gate electrode 41 and a first upper gate electrode 42. The second gate electrode 46 may include a second lower gate electrode 44 and a second upper gate electrode 45.

The first lower gate electrode 41 may include a PMOS work-function metal. The second lower gate electrode 44 may include an NMOS work-function metal. The first lower gate dielectric layer 33 may be formed between the first fin 27A and the first upper gate dielectric layer 34. The first lower gate dielectric layer 33 may directly contact the first fin 27A. The first upper gate dielectric layer 34 may surround side surfaces and a bottom of the first gate electrode 43. The second lower gate dielectric layer 36 may be formed between the second fin 28A and the second upper gate dielectric layer 37. The second lower gate dielectric layer 36 may directly contact the second fin 28A. The second upper gate dielectric layer 37 may surround side surfaces and a bottom of the second gate electrode 46.

Figure 4:
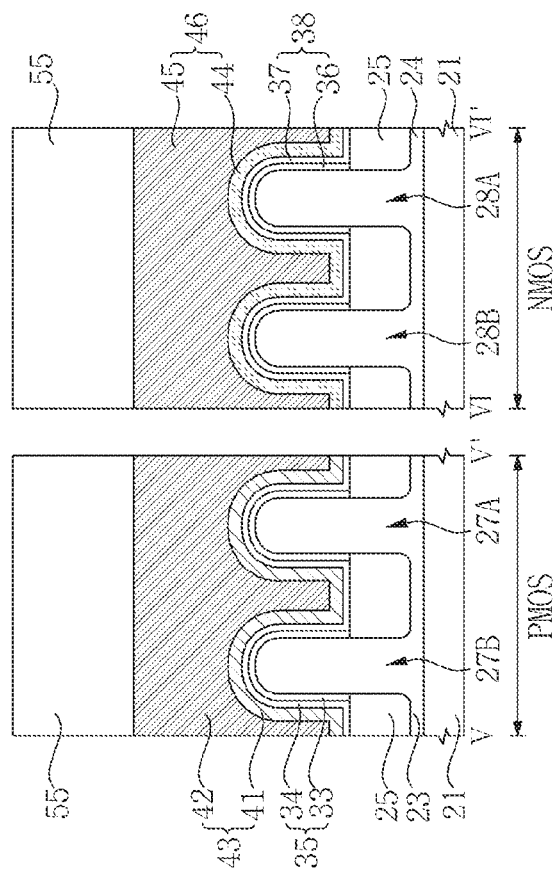
Figure 5:
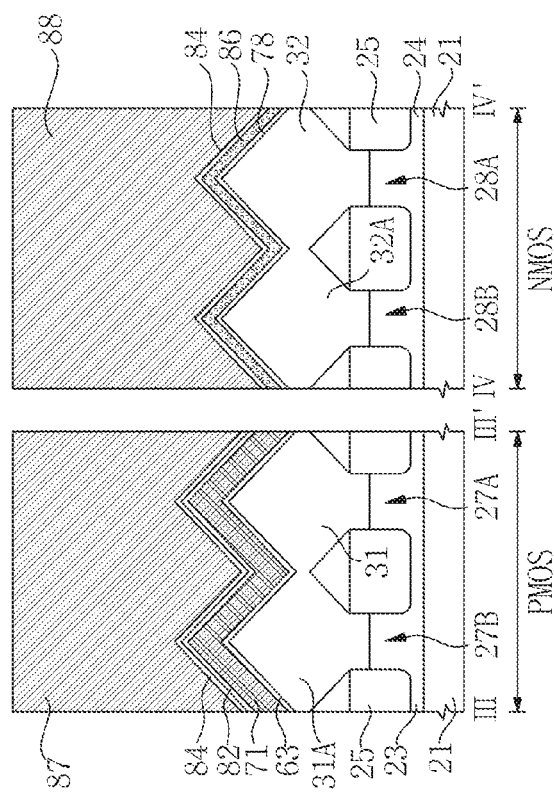

FIG. 2 shows layouts for describing a semiconductor device in accordance with some example embodiments of the inventive concepts. FIG. 3 shows cross-sectional views taken along lines I-I' and II-II' of FIG. 2. FIG. 4 shows cross-sectional views taken along lines III-III' and IV-IV' of FIG. 2. FIG. 5 shows cross-sectional views taken along lines V-V' and VI-VI' of FIG. 2.

Referring to FIG. 2, the semiconductor device in accordance with some example embodiments of the inventive concepts may include a PMOS area PMOS, an NMOS area NMOS, an N-well 23, a P-well 24, a first fin 27A, a second fin 28A, a third fin 27B, a fourth fin 28B, a plurality of first gate electrodes 43, a plurality of second gate electrodes 46, a plurality of first plugs 87, and a plurality of second plugs 88.

The N-well 23 may be formed in the PMOS area PMOS. The P-well 24 may be formed in the NMOS area NMOS. The first fin 27A and the third fin 27B may be defined on the N-well 23. The first fin 27A and the third fin 27B may be parallel to each other. The second fin 28A and the fourth fin 28B may be defined on the P-well 24. The second fin 28A and the fourth fin 28B may be parallel to each other.

The plurality of first gate electrodes 43 may be parallel to each other. Each of the plurality of first gate electrodes 43 may cross the first fin 27A and the third fin 27B. The plurality of second gate electrodes 46 may be parallel to each other. Each of the plurality of second gate electrodes 46 may cross the second fin 28A and the fourth fin 28B.

Each of the plurality of first plugs 87 may cross the first fin 27A and the third fin 27B. Each of the plurality of second plugs 88 may cross the second fin 28A and the fourth fin 28B. Each of the plurality of first plugs 87 and the plurality of second plugs 88 may have a bar shape. In some example embodiments, each of the plurality of first plugs 87 and the plurality of second plugs 88 may have a circular shape, a rectangular shape, or a polygonal shape.

Referring to FIG. 3, an N-well 23, a P-well 24, an isolation layer 25, a first fin 27A, a second fin 28A, a first source/drain area 31, a second source/drain area 32, a first gate dielectric layer 35, a second gate dielectric layer 38, a first gate electrode 43, a second gate electrode 46, a first spacer 47, a second spacer 48, an etch stop layer 51, a lower insulating layer 53, an upper insulating layer 55, a first plug impurity area 63, a second plug impurity area 78, a first metal silicide layer 71, a second metal silicide layer 86, a second metal layer 82, a second capping layer 84, a first plug 87, and a second plug 88 may be formed on a substrate 21 having a PMOS area PMOS and an NMOS area NMOS.

The first gate dielectric layer 35 may include a first lower gate dielectric layer 33 and a first upper gate dielectric layer 34. The second gate dielectric layer 38 may include a second lower gate dielectric layer 36 and a second upper gate dielectric layer 37. The first gate electrode 43 may include a first lower gate electrode 41 and a first upper gate electrode 42. The second gate electrode 46 may include a second lower gate electrode 44 and a second upper gate electrode 45.

Each of the first opening 57 and the second opening 58 may have a vertical height greater than a horizontal width. Each of the first plug 87 and the second plug 88 may have a vertical height greater than a horizontal width. An upper end of the isolation layer 25 may protrude more (or, alternatively, be at a higher level) than upper ends of the first fin 27A and the second fin 28A.

FIG. 1 may be partially enlarged views showing parts of FIG. 3 in detail.

Referring to FIG. 4, an N-well 23, a P-well 24, an isolation layer 25, a first fin 27A, a second fin 28A, a third fin 27B, a fourth fin 28B, a first source/drain area 31, a second source/drain area 32, a third source/drain area 31A, a fourth source/drain area 32A, a first plug impurity area 63, a second plug impurity area 78, a first metal silicide layer 71, a second metal silicide layer 86, a second metal layer 82, a second capping layer 84, a first plug 87, and a second plug 88 may be formed on a substrate 21 having a PMOS area PMOS and an NMOS area NMOS.

The first source/drain area 31 may be formed on the first fin 27A. The third source/drain area 31A may be formed on the third fin 27B. A side surface of the first source/drain area 31 may directly contact a side surface of the third source/drain area 31A. The second source/drain area 32 may be formed on the second fin 28A. The fourth source/drain area 32A may be formed on the fourth fin 28B. A side surface of the second source/drain area 32 may directly contact a side surface of the fourth source/drain area 32A.

The first plug impurity area 63 and the first metal silicide layer 71 may be sequentially formed in the first source/drain area 31 and the third source/drain area 31A. The first plug impurity area 63 may be formed between the first source/drain area 31 and the first metal silicide layer 71 and between the third source/drain area 31A and the first metal silicide layer 71. The second metal layer 82, the second capping layer 84, and the first plug 87 may be sequentially stacked on the first metal silicide layer 71.

The second plug impurity area 78 and the second metal silicide layer 86 may be sequentially formed in the second source/drain area 32 and the fourth source/drain area 32A. The second plug impurity area 78 may be formed between the second source/drain area 32 and the second metal silicide layer 86 and between the fourth source/drain area 32A and the second metal silicide layer 86. The second capping layer 84 and the second plug 88 may be sequentially stacked on the second metal silicide layer 86. The second capping layer 84 may directly contact the second metal silicide layer 86.

The first metal silicide layer 71 may have a thickness greater than the second metal silicide layer 86. Each of the first plug 87 and the second plug 88 may correspond to a merged contact plug.

Referring to FIG. 5, an N-well 23, a P-well 24, an isolation layer 25, a first fin 27A, a second fin 28A, a third fin 27B, a fourth fin 28B, a first gate dielectric layer 35, a second gate dielectric layer 38, a first gate electrode 43, a second gate electrode 46, and an upper insulating layer 55 may be formed on a substrate 21 having a PMOS area PMOS and an NMOS area NMOS.

Each of the first fin 27A, the second fin 28A, the third fin 27B, and the fourth fin 28B may have a vertical height greater than a horizontal width. Upper corners of the first fin 27A, the second fin 28A, the third fin 27B, and the fourth fin 28B may be roundly formed.

The first gate electrode 43 may be formed on the first fin 27A and the third fin 27B. The first gate electrode 43 may cover side surfaces of the first fin 27A and the third fin 27B. A lower end of the first gate electrode 43 may be formed at a level lower than upper ends of the first fin 27A and the third fin 27B. The lower end of the first gate electrode 43 may be formed at a level lower than vertical centers of the first fin 27A and the third fin 27B.

The second gate electrode 46 may be formed on the second fin 28A and the fourth fin 28B. The second gate electrode 46 may cover side surfaces of the second fin 28A and the fourth fin 28B. A lower end of the second gate electrode 46 may be formed at a level lower than upper ends of the second fin 28A and the fourth fin 28B. The lower end of the second gate electrode 46 may be formed at a level lower than vertical centers of the second fin 28A and the fourth fin 28B.

The upper insulating layer 55 may cover the first gate electrode 43 and the second gate electrode 46.

FIGS. 6 to 11 are cross-sectional views for describing a semiconductor device in accordance with some example embodiments of the inventive concepts.

Figure 6:
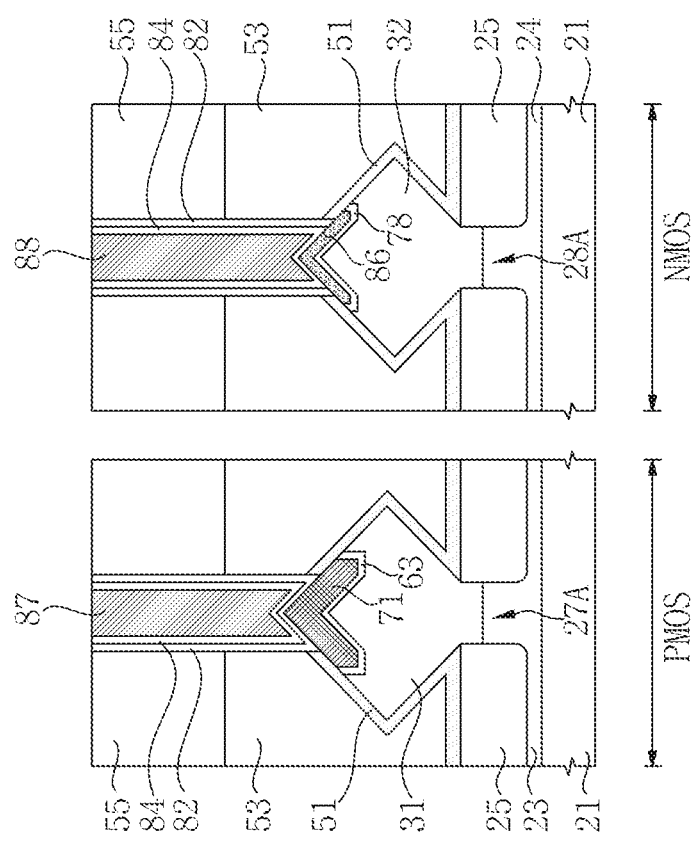

Referring to FIG. 6, an N-well 23, a P-well 24, an isolation layer 25, a first fin 27A, a second fin 28A, a first source/drain area 31, a second source/drain area 32, an etch stop layer 51, a lower insulating layer 53, a upper insulating layer 55, a first plug impurity area 63, a second plug impurity area 78, a first metal silicide layer 71, a second metal silicide layer 86, a second metal layer 82, a second capping layer 84, a first plug 87, and a second plug 88 may be formed on a substrate 21 having a PMOS area PMOS and an NMOS area NMOS. The first source/drain area 31 may be formed on the first fin 27A. The second source/drain area 32 may be formed on the second fin 28A. The etch stop layer 51 may cover the first source/drain area 31, the second source/drain area 32, and the isolation layer 25.

The first plug impurity area 63 and the first metal silicide layer 71 may be sequentially formed in the first source/drain area 31. The first plug impurity area 63 may be formed between the first source/drain area 31 and the first metal silicide layer 71. The second metal layer 82, the second capping layer 84, and the first plug 87, which pass through the upper insulating layer 55, the lower insulating layer 53, and the etch stop layer 51, may be sequentially stacked on the first metal silicide layer 71. The first plug impurity area 63 and the first metal silicide layer 71 may be aligned under the second metal layer 82, the second capping layer 84, and the first plug 87.

The second plug impurity area 78 and the second metal silicide layer 86 may be sequentially formed in the second source/drain area 32. The second plug impurity area 78 may be formed between the second source/drain area 32 and the second metal silicide layer 86. The second metal layer 82, the second capping layer 84, and the second plug 88, which pass through the upper insulating layer 55, the lower insulating layer 53, and the etch stop layer 51, may be formed on the second metal silicide layer 86. The second capping layer 84 may directly contact the second metal silicide layer 86. The second plug impurity area 78 and the second metal silicide layer 86 may be aligned under the second metal layer 82, the second capping layer 84, and the second plug 88. The first metal silicide layer 71 may have a thickness greater than the second metal silicide layer 86.

Referring to FIG. 7, lower ends of a second metal layer 82, a second capping layer 84, and a first plug 87 may be formed at a level lower than an upper end of the first source/drain area 31. A lower end of the first metal silicide layer 71 may be formed at a level lower than an upper end of the first fin 27A. Lower ends of the second capping layer 84 and the second plug 88 may be formed at a level lower than an upper end of the second source/drain area 32.

Referring to FIG. 8, lower ends of a second metal layer 82, a second capping layer 84, and a first plug 87 may be formed at a level lower than an upper end of the first source/drain area 31. A lower end of the first metal silicide layer 71 may be formed at a level lower than an upper end of the first fin 27A. Lower ends of the second capping layer 84 and the second plug 88 may be formed at a level lower than an upper end of the second source/drain area 32. A lower end of the second metal silicide layer 86 may be formed at a level lower than an upper end of the second fin 28A.

The lower end of the second plug 88 may be formed at a level lower than the lower end of the first plug 87. The lower end of the second metal silicide layer 86 may be formed at a level lower than the lower end of the first metal silicide layer 71.

Figure 9:
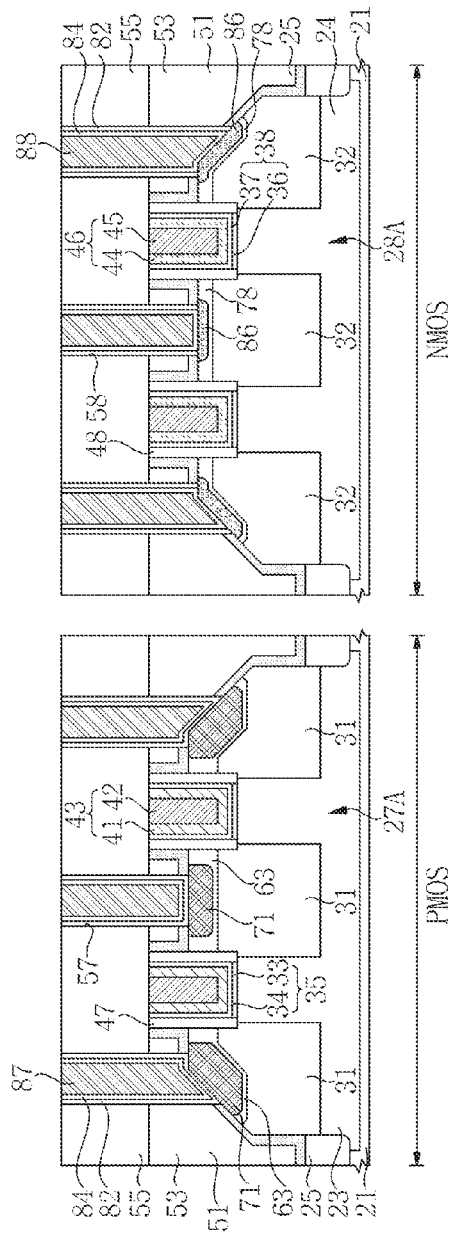

Referring to FIG. 9, an upper end of an isolation layer 25 may be formed at a level lower than upper ends of a first fin 27A and a second fin 28A.

Figure 10:
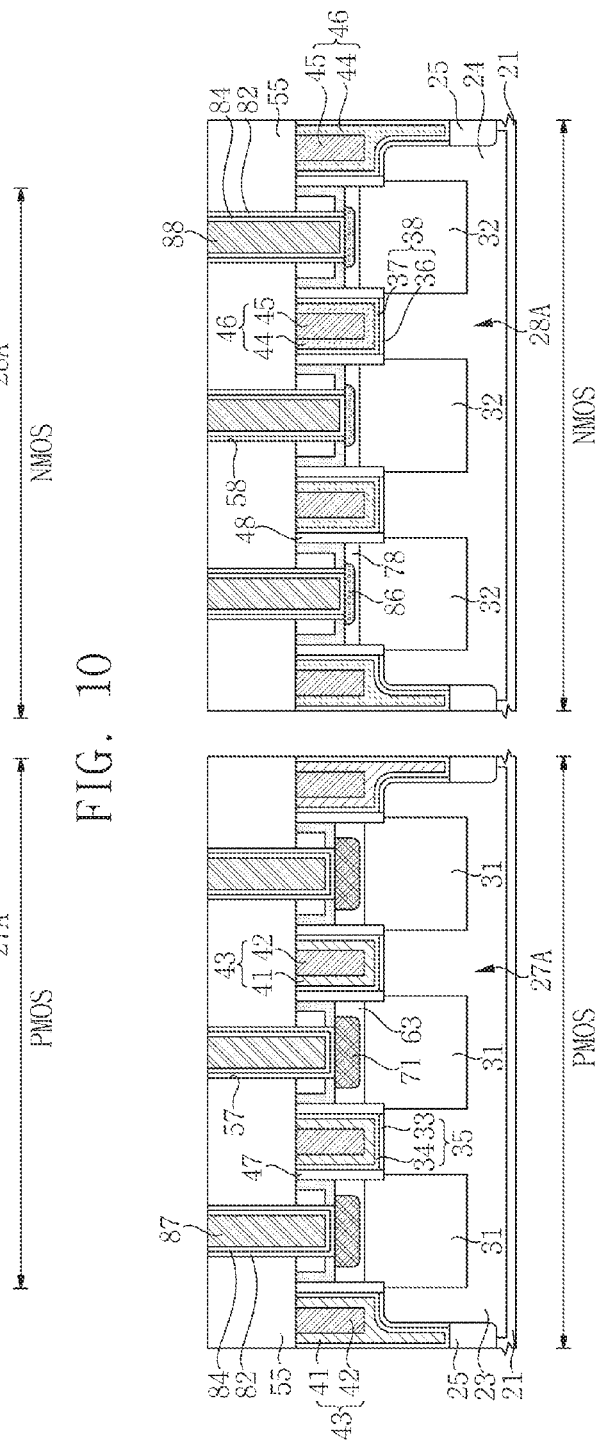

Referring to FIG. 10, some of a plurality of first gate electrodes 43 may be formed on an isolation layer 25 and a first fin 27A. Some of a plurality of second gate electrodes 46 may be formed on the isolation layer 25 and a second fin 28A.

Referring to FIG. 11, an etch stop layer 51 may cover a first source/drain area 31, a second source/drain area 32, a first gate electrode 43, a second gate electrode 46, a first spacer 47, a second spacer 48, and an isolation layer 25. The etch stop layer 51 may contact upper surfaces of a first upper gate dielectric layer 34, a second upper gate dielectric layer 37, a first lower gate electrode 41, a first upper gate electrode 42, a second lower gate electrode 44, and a second upper gate electrode 45. The etch stop layer 51 may contact side surfaces of the first spacer 47 and the second spacer 48. The etch stop layer 51 may contact a first metal silicide layer 71 and a second metal silicide layer 86.

FIGS. 12 to 27 are cross-sectional views taken along lines I-I' and II-II' of FIG. 2 for describing a method of manufacturing a semiconductor device in accordance with some example embodiments of the inventive concepts.

Referring to FIGS. 2 and 12, an N-well 23, a P-well 24, an isolation layer 25, a first fin 27A, a second fin 28A, a first source/drain area 31, a second source/drain area 32, a first gate dielectric layer 35, a second gate dielectric layer 38, a first gate electrode 43, a second gate electrode 46, a first spacer 47, a second spacer 48, an etch stop layer 51, a lower insulating layer 53, and an upper insulating layer 55 may be formed on a substrate 21 having a PMOS area PMOS and an NMOS area NMOS.

The first gate dielectric layer 35 may include a first lower gate dielectric layer 33 and a first upper gate dielectric layer 34. The second gate dielectric layer 38 may include a second lower gate dielectric layer 36 and a second upper gate dielectric layer 37. The first gate electrode 43 may include a first lower gate electrode 41 and a first upper gate electrode 42. The second gate electrode 46 may include a second lower gate electrode 44 and a second upper gate electrode 45. The first gate electrode 43 and the second gate electrode 46 may be referred to as a replacement gate electrode.

The substrate 21 may be a semiconductor substrate such as a silicon wafer or a silicon on insulator (SOI) wafer. For example, the substrate 21 may be a single crystal silicon wafer having P-type impurities. The N-well 23 may be defined in the PMOS area PMOS. The N-well 23 may include N-type impurities. For example, the N-well 23 may include single crystal silicon having N-type impurities. The P-well 24 may be defined in the NMOS area NMOS. The P-well 24 may include P-type impurities. For example, the P-well 24 may include single crystal silicon having P-type impurities. The P-well 24 may be omitted.

The first fin 27A may be defined by the isolation layer 25 in the N-well 23 and the second fin 28A may be defined by the isolation layer 25 in the P-well 24. The isolation layer 25 may be formed using a shallow trench isolation (STI) technique. The isolation layer 25 may include an insulating material such as silicon oxide, silicon nitride, silicon oxynitride, or a combination thereof. An upper end of the isolation layer 25 may be formed at a level higher than upper ends of the first fin 27A and the second fin 28A. The first fin 27A may include single crystal silicon having N-type impurities. The second fin 28A may include single crystal silicon having P-type impurities.

The first gate dielectric layer 35 may be formed on the first fin 27A. The first gate electrode 43 may be formed on the first gate dielectric layer 35. The first lower gate dielectric layer 33 may be formed between the first fin 27A and the first upper gate dielectric layer 34. The first lower gate dielectric layer 33 may directly contact the first fin 27A. The first upper gate dielectric layer 34 may surround side surfaces and a bottom of the first gate electrode 43. An upper end of the first upper gate dielectric layer 34 may be formed at a level higher than a center of the first gate electrode 43. The first lower gate electrode 41 may surround side surfaces and a bottom of the first upper gate electrode 42. The first lower gate electrode 41 may directly contact the first upper gate dielectric layer 34.

The second gate dielectric layer 38 may be formed on the second fin 28A. The second gate electrode 46 may be formed on the second gate dielectric layer 38. The second lower gate dielectric layer 36 may be formed between the second fin 28A and the second upper gate dielectric layer 37. The second lower gate dielectric layer 36 may directly contact the second fin 28A. The second upper gate dielectric layer 37 may surround side surfaces and a bottom of the second gate electrode 46. An upper end of the second upper gate dielectric layer 37 may be formed at a level higher than a center of the second gate electrode 46. The second lower gate electrode 44 may surround side surfaces and a bottom of the second upper gate electrode 45. The second lower gate electrode 44 may directly contact the second upper gate dielectric layer 37.

Each of the first gate dielectric layer 35 and the second gate dielectric layer 38 may include silicon oxide, silicon nitride, silicon oxynitride, a high-k dielectric, or a combination thereof. Each of the first gate electrode 43 and the second gate electrode 46 may include a metal, a metal nitride, a metal oxide, a metal silicide, polysilicon, conductive carbon, or a combination thereof.

For example, each of the first lower gate dielectric layer 33 and the second lower gate dielectric layer 36 may include a chemical oxide formed by a cleaning process. Each of the first lower gate dielectric layer 33 and the second lower gate dielectric layer 36 may include silicon oxide by reaction of $H_2O_2$ and Si. Each of the first lower gate dielectric layer 33 and the second lower gate dielectric layer 36 may be referred to as an interfacial oxide. Each of the first upper gate dielectric layer 34 and the second upper gate dielectric layer 37 may include a high-k dielectric.

For example, the first lower gate electrode 41 may include a PMOS work-function metal. The first lower gate electrode 41 may include TiN or TaN. The second lower gate electrode 44 may include an NMOS work-function metal. The second lower gate electrode 44 may include TiAl or TiAlC. Each of the first upper gate electrode 42 and the second upper gate electrode 45 may include W or Al.

The first spacer 47 may be formed on side surfaces of the first gate electrode 43. The first upper gate dielectric layer 34 may extend between the first spacer 47 and the first gate electrode 43. The second spacer 48 may be formed on side surfaces of the second gate electrode 46. The second upper gate dielectric layer 37 may extend between the second spacer 48 and the second gate electrode 46. Each of the first spacer 47 and the second spacer 48 may include silicon oxide, silicon nitride, silicon oxynitride, or a combination thereof. For example, each of the first spacer 47 and the second spacer 48 may include silicon nitride.

The first source/drain area 31 may be formed on the first fin 27A adjacent to an outside of the first gate electrode 43. The formation of the first source/drain area 31 may include a process in which the first fin 27A is partially recessed and a process in which a semiconductor crystal is grown on the recessed first fin 27A. The first source/drain area 31 may include a crystal growth material. The first source/drain area 31 may include SiGe, Si, or a combination thereof by a selective epitaxial growth (SEG) method. The first source/drain area 31 may include P-type impurities. A lower end of the first source/drain area 31 may be formed at a level lower than an upper end of the first fin 27A. An upper end of the first source/drain area 31 may be formed at a level higher than the upper end of the first fin 27A. The upper end of the first source/drain area 31 may be formed at a level higher than an area adjacent to a lower surface of the first gate electrode 43.

The second source/drain area 32 may be formed on the second fin 28A adjacent to an outside of the second gate electrode 46. The formation of the second source/drain area 32 may include a process in which the second fin 28A is partially recessed and a process in which a semiconductor crystal is grown on the recessed second fin 28A. The second source/drain area 32 may include a crystal growth material. The second source/drain area 32 may include SiC, Si, or a combination thereof by a SEG method. The second source/drain area 32 may include N-type impurities. A lower end of the second source/drain area 32 may be formed at a level lower than an upper end of the second fin 28A. An upper end of the second source/drain area 32 may be formed at a level higher than the upper end of the second fin 28A. The upper end of the second source/drain area 32 may be formed at a level higher than an area adjacent to a lower surface of the second gate electrode 46. The upper end of the second source/drain area 32 may be formed at a level lower than the upper end of the first source/drain area 31.

The etch stop layer 51 may cover the first source/drain area 31, the second source/drain area 32, and the isolation layer 25. The etch stop layer 51 may cover side surfaces of the first spacer 47 and the second spacer 48. The lower insulating layer 53 may be formed on the etch stop layer 51. Upper ends of the etch stop layer 51, the lower insulating layer 53, the first spacer 47, the second spacer 48, the first upper gate dielectric layer 34, the second upper gate dielectric layer 37, the first lower gate electrode 41, the second lower gate electrode 44, the first upper gate electrode 42, and the second upper gate electrode 45 may be exposed on substantially the same plane. The upper insulating layer 55 may cover the etch stop layer 51, the lower insulating layer 53, the first spacer 47, the second spacer 48, the first upper gate dielectric layer 34, the second upper gate dielectric layer 37, the first lower gate electrode 41, the second lower gate electrode 44, the first upper gate electrode 42, and the second upper gate electrode 45.

The etch stop layer 51 may include a material having an etch selectivity with respect to the lower insulating layer 53 and the upper insulating layer 55. The etch stop layer 51 may include silicon oxide, silicon nitride, silicon oxynitride, or a combination thereof. Each of the lower insulating layer 53 and the upper insulating layer 55 may include silicon oxide, silicon nitride, silicon oxynitride, or a combination thereof. For example, each of the lower insulating layer 53 and the upper insulating layer 55 may include silicon oxide, and the etch stop layer 51 may include silicon nitride.

Referring to FIGS. 2 and 13, a first opening 57 and a second opening 58, which pass through the upper insulating layer 55 and the lower insulating layer 53, may be formed. A patterning process may be applied to the formation of the first opening 57 and the second opening 58. The etch stop layer 51 may be exposed by (or, alternatively, through) bottoms of the first opening 57 and the second opening 58. The first opening 57 may be formed in the PMOS area PMOS, and the second opening 58 may be formed in the NMOS area NMOS. Each of the first opening 57 and the second opening 58 may have a vertical height greater than a horizontal width. Each of the first opening 57 and the second opening 58 may be a contact hole or a trench.

Referring to FIGS. 2 and 14, a first blocking layer 59 and a first mask layer 61, which cover the NMOS area NMOS and expose the PMOS area PMOS, may be formed using a thin film formation process and a patterning process. The first blocking layer 59 may fill the second opening 58. The first blocking layer 59 may include a material having an etch selectivity with respect to the lower insulating layer 53, the upper insulating layer 55, and the etch stop layer 51. The first blocking layer 59 may include a spin on hardmask (SOH) material or a spin on glass (SOG) material, which is available at a temperature of 800° C. or more (or, alternatively, about 800° C. or more). The first mask layer 61 may include a photoresist.

Referring to FIGS. 2 and 15, the first source/drain area 31 may be exposed in (or, alternatively, though) the first opening 57 by removing the exposed etch stop layer 51. An anisotropic etching process may be applied to remove the etch stop layer 51. The first mask layer 61 may be removed. In some example embodiments, the first mask layer 61 may be removed before the etch stop layer 51 is removed.

Referring to FIGS. 2 and 16, a first plug impurity area 63 and a first amorphous layer 65 may be formed in the first source/drain area 31 using an ion implantation process. The first plug impurity area 63 may be formed so as to surround a bottom of the first amorphous layer 65. The first plug impurity area 63 may include P-type impurities. The first amorphous layer 65 may be formed using a pre-amorphization implant (PAI) process. The first amorphous layer 65 may include Ge. The first amorphous layer 65 may be aligned under the first opening 57.

Referring to FIGS. 2 and 17, a first metal layer 67 and a first capping layer 69 may be formed. The first metal layer 67 may directly contact the first amorphous layer 65. The first capping layer 69 may cover the first metal layer 67. The first metal layer 67 may include at least one of Ni, NiPt, Co, CoPt, Ta, TaPt, or a combination thereof. For example, the first metal layer 67 may include NiPt. The first capping layer 69 may include TiN.

Referring to FIGS. 2 and 18, a first metal silicide layer 71 may be formed using a first heat treatment process. The first heat treatment process may be performed at a temperature of about 600° C. for about 30 seconds. The first metal silicide layer 71 may be formed by reaction of the first amorphous layer 65 and the first metal layer 67 while the first heat treatment process is performed. The first metal silicide layer 71 may include at least one of NiSi, NiPtSi, CoSi, CoPtSi, TaSi, TaPtSi, or a combination thereof. For example, the first metal silicide layer 71 may include NiSi and/or NiPtSi.

Referring to FIGS. 2 and 19, the first metal layer and the first capping layer 69 may be removed. The first metal silicide layer 71 may be exposed by (or, alternatively, through) the bottom of the first opening 57.

Referring to FIGS. 2 and 20, the first metal silicide layer 71 may be stabilized using a second heat treatment process. The second heat treatment process may be performed at a temperature of about 800° C. for one to two seconds. The first blocking layer 59 may remain in the second opening 58 while the second heat treatment process is performed.

Referring to FIGS. 2 and 21, a second blocking layer 74 and a second mask layer 76, which cover the PMOS area PMOS and expose the NMOS area NMOS, may be formed using a thin film formation process and a patterning process. The second opening 58 may be exposed by removing the first blocking layer 59.

The second blocking layer 74 may fill the first opening 57. The second blocking layer 74 may include a material having an etch selectivity with respect to the lower insulating layer 53, the upper insulating layer 55, and the etch stop layer 51. The second blocking layer 74 may include an SOH material or an SOG material, which is available at a temperature of 800° C. or more (or, alternatively, about 800° C. or more). The second mask layer 76 may include a photoresist.

Referring to FIGS. 2 and 22, the second source/drain area 32 may be exposed in the second opening 58 by removing the exposed etch stop layer 51. An anisotropic etching process may be applied to remove the etch stop layer 51. The second mask layer 76 may be removed. In some example embodiments, the second mask layer 76 may be removed before the etch stop layer 51 is removed.

Figure 23:
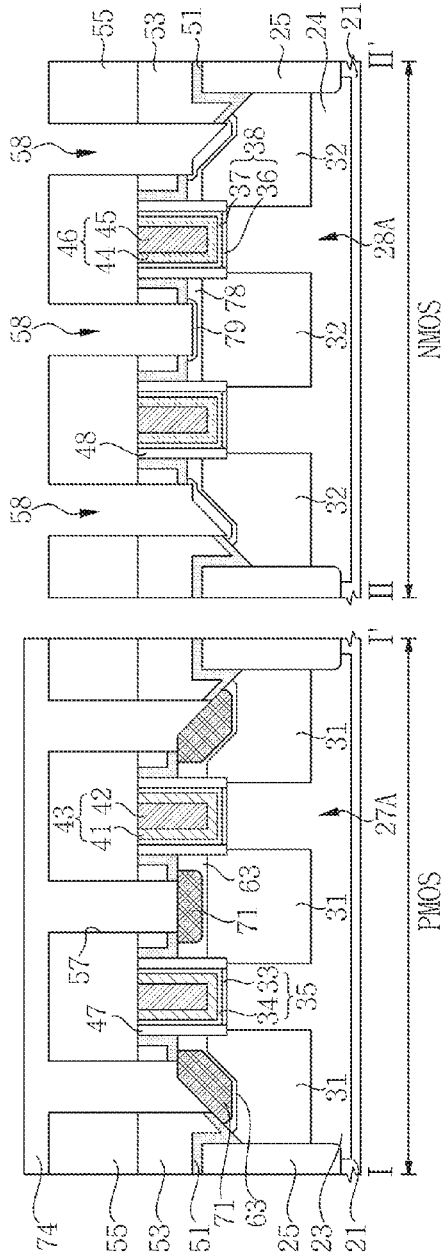

Referring to FIGS. 2 and 23, a second plug impurity area 78 and second amorphous layer 79 may be formed in the second source/drain area 32 using an ion implantation process. The second plug impurity area 78 may have a thickness smaller than the first plug impurity area 63. The second amorphous layer 79 may have a thickness smaller than the first amorphous layer 65. The second plug impurity area 78 may be formed so as to surround a bottom of the second amorphous layer 79. The second plug impurity area 78 may include N-type impurities. The second amorphous layer 79 may be formed using a PAI process. The second amorphous layer 79 may include Ge. The second amorphous layer 79 may be aligned under the second opening 58.

Figure 24:
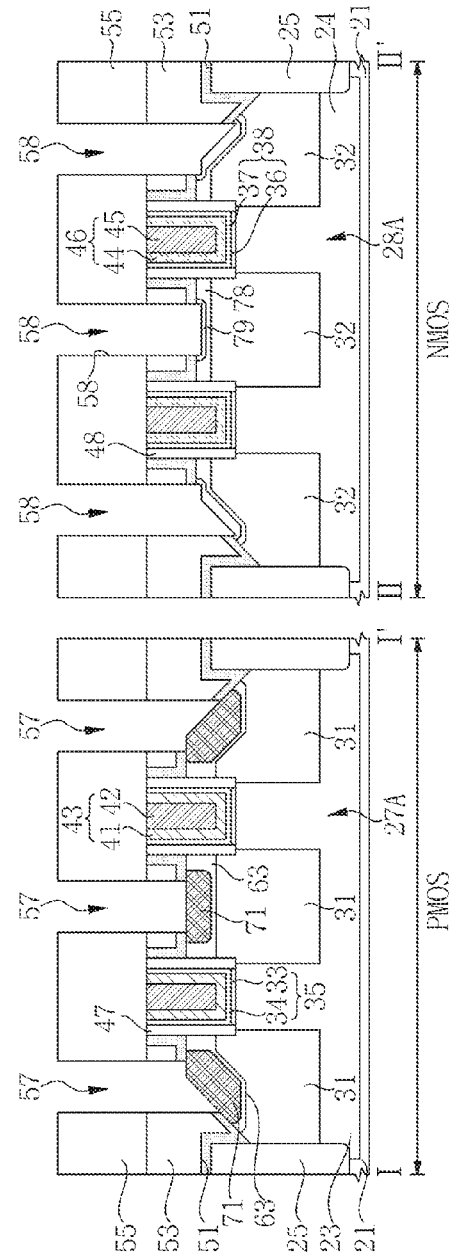

Referring to FIGS. 2 and 24, the first opening 57 may be exposed by removing the second blocking layer 74.

Referring to FIGS. 2 and 25, a second metal layer 82 and a second capping layer 84 may be formed to cover inner walls of the first opening 57 and the second opening 58 and to cover the upper insulating layer 55. The second metal layer 82 may directly contact the second amorphous layer 79 and the first metal silicide layer 71. The second capping layer 84 may cover the second metal layer 82. The second metal layer 82 may include Ti. The second capping layer 84 may include TiN.

Referring to FIGS. 2 and 26, a second metal silicide layer 86 may be formed using a third heat treatment process. The third heat treatment process may be performed at a temperature of about 800° C. for one to two seconds. The second metal silicide layer 86 may be formed by reaction of the second amorphous layer 79 and the second metal layer 82 while the third heat treatment process is performed. The second metal silicide layer 86 may include TiSi. The second metal silicide layer 86 may have a thickness smaller than the first metal silicide layer 71. The second metal layer 82 may remain on the first metal silicide layer 71.

Figure 27:
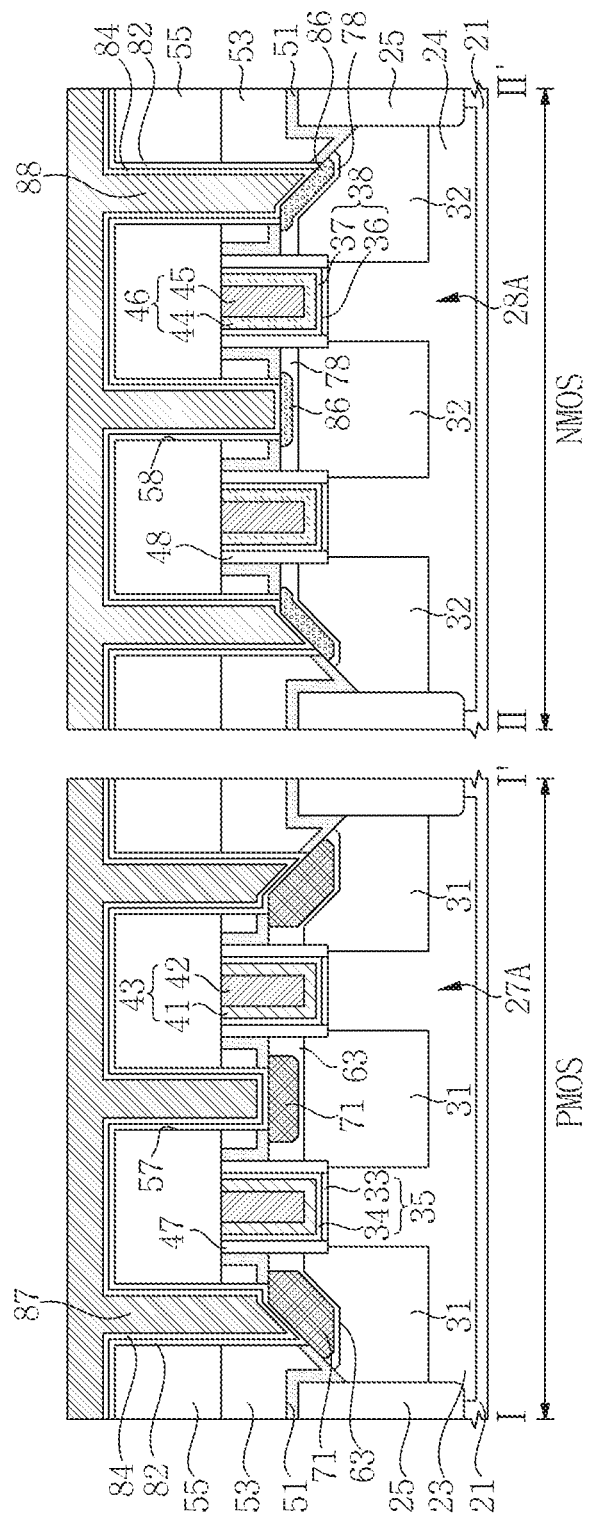

Referring to FIGS. 2 and 27, a first plug 87 may be formed to fill the first opening 57 and a second plug 88 may be formed to fill the second opening 58. Each of the first plug 87 and the second plug 88 may include a metal, a metal nitride, a metal oxide, conductive carbon, or a combination thereof. For example, each of the first plug 87 and the second plug 88 may include W. The second capping layer 84 may serve as a barrier layer.

FIGS. 28 to 43 are cross-sectional views for describing a method of manufacturing a semiconductor device in accordance with some example embodiments of the inventive concepts.

Referring to FIG. 28, an N-well 123, a P-well 124, a first source/drain area 131, a second source/drain area 132, an etch stop layer 151, and an upper insulating layer 156 may be formed on a substrate 121 having a PMOS area PMOS and an NMOS area NMOS. The first source/drain area 131 may include a semiconductor layer having P-type impurities. The second source/drain area 132 may include a semiconductor layer having N-type impurities.

Referring to FIG. 29, a first opening 157 and a second opening 158 may be formed.

Referring to FIG. 30, a first blocking layer 159 and a first mask layer 161 may be formed. The first blocking layer 159 may include an SOH material or an SOG material, which is available at a temperature of 800° C. or more (or, alternatively, about 800° C. or more). The first mask layer 161 may include a photoresist.

Referring to FIG. 31, the first source/drain area 131 may be exposed in the first opening 157 by removing the exposed etch stop layer 151.

Referring to FIG. 32, a first plug impurity area 163 and a first amorphous layer 165 may be formed. The first plug impurity area 163 may include P-type impurities. The first amorphous layer 165 may be formed using a PAI process. The first amorphous layer 165 may include Ge. The first amorphous layer 165 may be aligned under the first opening 157.

Referring to FIG. 33, a first metal layer 167 and a first capping layer 169 may be formed. The first metal layer 167 may directly contact the first amorphous layer 165. The first capping layer 169 may cover the first metal layer 167. The first metal layer 167 may include at least one of Ni, NiPt, Co, CoPt, Ta, TaPt, or a combination thereof. For example, the first metal layer 167 may include NiPt. The first capping layer 169 may include TiN.

Referring to FIG. 34, a first metal silicide layer 171 may be formed using a first heat treatment process. The first heat treatment process may be performed at a temperature of about 600° C. for about 30 seconds. The first metal silicide layer 171 may be formed by reaction of the first amorphous layer 165 and the first metal layer 167 while the first heat treatment process is performed. The first metal silicide layer 171 may include at least one of NiSi, NiPtSi, CoSi, CoPtSi, TaSi, TaPtSi, or a combination thereof. For example, the first metal silicide layer 171 may include NiSi and/or NiPtSi.

Referring to FIG. 35, the first metal layer 167 and the first capping layer 169 may be removed.

Referring to FIG. 36, the first metal silicide layer 171 may be stabilized using a second heat treatment process. The second heat treatment process may be performed at a temperature of about 800° C. for one to two seconds. The first blocking layer 159 may remain in the second opening 158 while the second heat treatment process is performed.

Referring to FIG. 37, a second blocking layer 174 and a second mask layer 176 may be formed. The first blocking layer 159 may be removed. The second blocking layer 174 may fill the first opening 157. The second blocking layer 174 may include an SOH material or an SOG material, which is available at a temperature of 800° C. or more (or, alternatively, about 800° C. or more). The second mask layer 176 may include a photoresist.

Referring to FIG. 38, the second source/drain area 132 may be exposed in (or, alternatively, through) the second opening 158 by removing the exposed etch stop layer 151.

Referring to FIG. 39, a second plug impurity area 178 and a second amorphous layer 179 may be formed. The second amorphous layer 179 may have a thickness smaller than the first amorphous layer 165. The second plug impurity area 178 may be formed so as to surround a bottom of the second amorphous layer 179. The second plug impurity area 178 may include N-type impurities. The second amorphous layer 179 may be formed using a PAI process. The second amorphous layer 179 may include Ge. The second amorphous layer 179 may be aligned under the second opening 158.

Referring to FIG. 40, the second blocking layer 174 may be removed.

Referring to FIG. 41, a second metal layer 182 and a second capping layer 184 may be formed. The second metal layer 182 may directly contact the second amorphous layer 179 and the first metal silicide layer 171. The second capping layer 184 may cover the second metal layer 182. The second metal layer 182 may include Ti. The second capping layer 184 may include TiN.

Referring to FIG. 42, a second metal silicide layer 186 may be formed using a third heat treatment process. The third heat treatment process may be performed at a temperature of about 800° C. for one to two seconds. The second metal silicide layer 186 may be formed by reaction of the second amorphous layer 179 and the second metal layer 182 while the third heat treatment process is performed. The second metal silicide layer 186 may include TiSi. The second metal silicide layer 186 may have a thickness smaller than the first metal silicide layer 171. The second metal layer 182 may remain on the first metal silicide layer 171. A lower end of the second metal silicide layer 186 may be formed at a level higher than a lower end of the first metal silicide layer 171.

Referring to FIG. 43, a first plug 187 may be formed to fill the first opening 157, and a second plug 188 may be formed to fill the second opening 158. A thin film formation process and a planarization process may be applied to the formation of the first plug 187 and the second plug 188.

Figure 45:
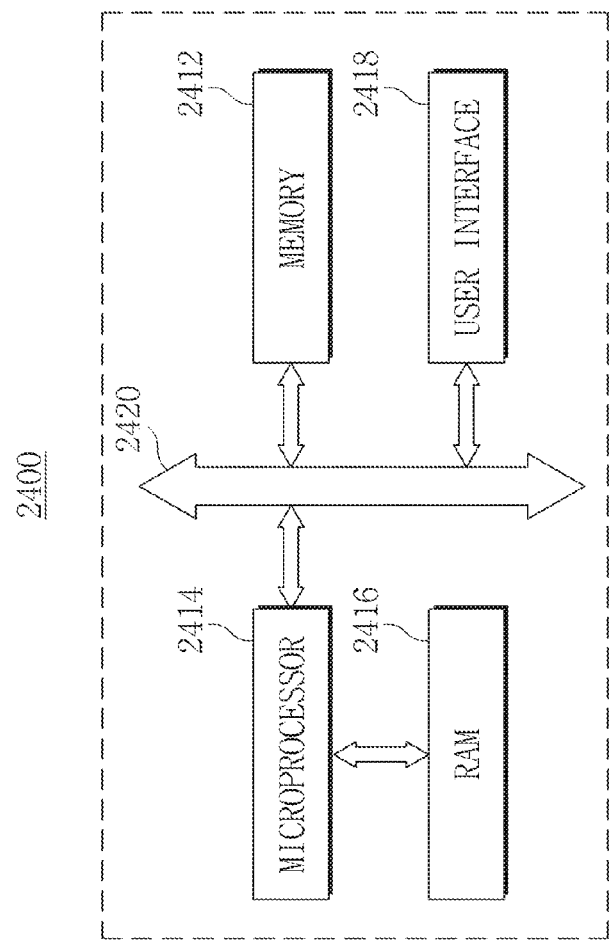
Figure 44:
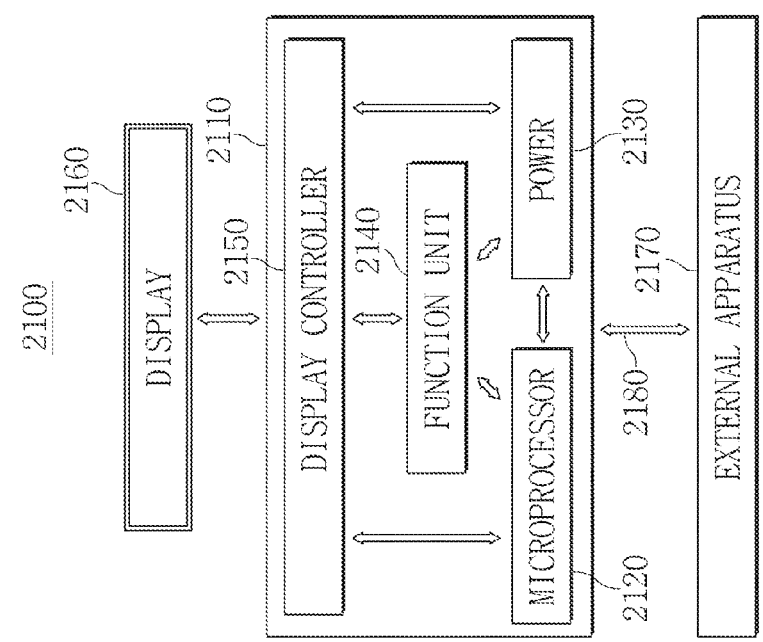

FIGS. 44 and 45 are system block diagrams of electronic devices in accordance with some example embodiments of the inventive concepts.

Referring to FIG. 44, the semiconductor devices similar to those described with reference to FIGS. 1 to 43 may be applied to an electronic system 2100. The electronic system 2100 may include a body 2110, a microprocessor 2120, a power supply 2130, a function unit 2140, and a display controller 2150. The body 2110 may be a mother board formed by a printed circuit board (PCB). The microprocessor 2120, the power supply 2130, the function unit 2140, and the display controller 2150 may be mounted on the body 2110. A display 2160 may be disposed inside the body 2110 or outside the body 2110. For example, the display 2160 may be disposed on a surface of the body 2110, and then may display an image processed by the display controller 2150.

The power supply 2130 may receive a constant voltage from an external power supply, divide the voltage into various voltages levels, and supply those voltages to the microprocessor 2120, the function unit 2140, the display controller 2150, etc. The microprocessor 2120 may receive a voltage from the power supply 2130 to control the function unit 2140 and the display 2160. The function unit 2140 may perform various functions of the electronic system 2100. For example, when the electronic system 2100 is a smart phone, the function unit 2140 may include various components which perform mobile phone functions such as dialing, image output to the display 2160, or voice output to a speaker through communication with an external apparatus 2170, and when a camera is included, the function unit 2140 may serve as a camera image processor.

In some example embodiments, when the electronic system 2100 is connected to a memory card to expand the capacity, the function unit 2140 may be a memory card controller. The function unit 2140 may exchange signals with the external apparatus 2170 through a wired or wireless communication unit 2180. Furthermore, when the electronic system 2100 requires a Universal Serial Bus (USB) to expand the functions, the function unit 2140 may serve as an interface controller. In addition, the function unit 2140 may include a mass storage device.

The semiconductor devices similar to those described with reference to FIGS. 1 to 43 may be applied to the function unit 2140 or the microprocessor 2120.

Referring to FIG. 45, an electronic system 2400 may include at least one of the semiconductor devices in accordance with various example embodiments of the inventive concepts. The electronic system 2400 may be applied to a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be connected to each other through the bus 2420. The user interface 2418 may be used to input data to the electronic system 2400, or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled within a single package. The memory system 2412 may store operational codes of the microprocessor 2414, data processed by the microprocessor 2414, or data received from the outside. The memory system 2412 may include a controller and a memory.

The semiconductor devices similar to those described with reference to FIGS. 1 to 43 may be applied to the microprocessor 2414, the RAM 2416, or the memory system 2412.

According to example embodiments of the inventive concepts, a first opening is formed in a PMOS area and a second opening is formed in an NMOS area. A first blocking layer which fills the second opening is formed. The first blocking layer may include an SOH material or an SOG material, which is available at a temperature of 800° C. or more (or, alternatively, about 800° C. or more). A first metal silicide layer is formed in an exposed first source/drain area in the first opening. The first metal silicide layer may include at least one of NiSi, NiPtSi, CoSi, CoPtSi, TaSi, TaPtSi, or a combination thereof. A second source/drain area may be exposed in the second opening. A second metal silicide layer is formed in the second source/drain area. The second metal silicide layer may include TiSi. Therefore, a semiconductor device having an excellent electrical characteristic can be implemented.

Although some example embodiments have been described with reference to the accompanying drawings, those skilled in the art will readily appreciate that many modifications are possible in embodiments without departing from the scope and without changing essential features.

Therefore, the above-described example embodiments should be considered in a descriptive sense only and not for purposes of limitation.

What is claimed is:

1. A semiconductor device, comprising:
a first fin and a second fin on a substrate, the first fin having N-type impurities and the second fin having P-type impurities;
a first gate electrode crossing the first fin and covering at least one side surface of the first fin;
a second gate electrode crossing the second fin and covering at least one side surface of the second fin;
a first source/drain area on the first fin and adjacent to a side surface of the first gate electrode;
a second source/drain area on the second fin and adjacent to a side surface of the second gate electrode;
an etch stop layer including a first etch stop layer portion on the first source/drain area and a second etch stop layer portion on the second source/drain area;
an insulating layer on the etch stop layer;
a first plug connected to the first source/drain area through the insulating layer and the etch stop layer;
a first metal silicide layer in the first source/drain area and aligned with the first plug;
a second plug connected to the second source/drain area through the insulating layer and the etch stop layer; and
a second metal silicide layer in the second source/drain area and aligned with the second plug,
the second metal silicide layer having a material different from a material of the first metal silicide layer, and
an upper end of the first metal silicide layer being at a level higher than an upper end of the second metal silicide layer.

2. The device of claim 1, wherein
the first metal silicide layer comprises at least one selected from NiSi, NiPtSi, CoSi, CoPtSi, TaSi, TaPtSi, and a combination thereof, and
the second metal silicide layer comprises TiSi.

3. The device of claim 1, further comprising:
a first gate dielectric layer between the first fin and the first gate electrode; and
a second gate dielectric layer between the second fin and the second gate electrode,
an upper end of the first gate dielectric layer being at a level higher than a center of the first gate electrode, and
an upper end of the second gate dielectric layer being at a level higher than a center of the second gate electrode.

4. The device of claim 3, wherein the first gate dielectric layer comprises:
a lower dielectric layer directly contacting the first fin; and
an upper dielectric layer directly contacting a bottom and side surfaces of the first gate electrode, the upper dielectric layer being between the lower dielectric layer and the first gate electrode.

5. The device of claim 1, further comprising:
a first metal layer surrounding side surfaces and bottoms of the first plug and the second plug; and
a second metal layer between the first metal layer and the first metal silicide layer and between the first metal layer and the insulating layer,
the first metal layer directly contacting the second metal silicide layer.

6. The device of claim 5, wherein
the first metal layer is a TiN layer, and
the second metal layer is a Ti layer.

7. The device of claim 1, wherein a lower surface of the second metal silicide layer is at a level higher than a lower surface of the first metal silicide layer.

8. The device of claim 1, wherein
a lower surface of the first metal silicide layer is at a level higher than a lower surface of the first gate electrode, and
a lower surface of the second metal silicide layer is at a level higher than a lower surface of the second gate electrode.

9. The device of claim 1, wherein
an upper surface of the first metal silicide layer is at a level higher than a lower surface of the first plug, and
an upper surface of the second metal silicide layer is at a level higher than a lower surface of the second plug.

10. The device of claim 1, further comprising:
an isolation layer in a periphery of the first fin and the second fin,
an upper end of the isolation layer being at a level higher than upper ends of the first fin and the second fin.

11. The device of claim 1, wherein each of the first fin and the second fin has a vertical height greater than a horizontal width.

12. The device of claim 1, wherein each of the first plug and the second plug has a vertical height greater than a horizontal width.

13. A semiconductor device, comprising:
a first fin and a second fin on a substrate, the first and second fins having N-type impurities and being spaced apart from each other;
a third fin and a fourth fin on the substrate, the third and fourth fins having P-type impurities and being spaced apart from each other;
a first source/drain area on the first fin;
a second source/drain area on the second fin and contacting the first source/drain area;
a third source/drain area on the third fin;
a fourth source/drain area on the fourth fin and contacting the third source/drain area;
a first plug on the first source/drain area and the second source/drain area;
a first metal silicide layer between the first plug and the first source/drain area and between the first plug and the second source/drain area;
a second plug on the third source/drain area and the fourth source/drain area; and
a second metal silicide layer between the second plug and the third source/drain area and between the second plug and the fourth source/drain area, an upper end of the first metal silicide layer being at a level higher than an upper end of the second metal silicide layer,
the second metal silicide layer having a material different from a material of the first metal silicide layer and a thickness smaller than a thickness of the first metal silicide layer.

14. The device of claim 13, wherein
side surfaces of the first source/drain area and the second source/drain area contact each other, and
side surfaces of the third source/drain area and the fourth source/drain area contact each other.

15. A semiconductor device, comprising:
a first fin and a second fin on a substrate, the first and second fins having first-type impurities and being spaced apart from each other;
a third fin and a fourth fin on the substrate, the third and fourth fins having second-type impurities and being spaced apart from each other;

a first source/drain area on the first fin;
a second source/drain area on the second fin and contacting the first source/drain area;
a third source/drain area on the third fin;
a fourth source/drain area on the fourth fin;
a first plug on the first source/drain area and the second source/drain area;
a first metal silicide layer between the first plug and the first source/drain area and between the first plug and the second source/drain area;
a second plug on the third source/drain area and the fourth source/drain area; and
a second metal silicide layer between the second plug and the third source/drain area and between the second plug and the fourth source/drain area, an upper end of the first metal silicide layer being at a level higher than an upper end of the second metal silicide layer,
the second metal silicide layer having a material different from a material of the first metal silicide layer.

16. The device of claim 15, wherein the fourth source/drain area contacts the third source/drain area.

17. The device of claim 15, wherein a thickness of the second metal silicide layer is smaller than a thickness of the first metal silicide layer.

18. The device of claim 1, wherein a thickness of the second metal silicide layer is smaller than a thickness of the first metal silicide layer.

19. The device of claim 1, wherein an upper end of the first source/drain area is at a level higher than an upper end of the first fin.

20. The device of claim 1, wherein an upper end of the second source/drain area is at a level higher than an upper end of the second fin.

* * * * *